(12) United States Patent
Lee et al.

(10) Patent No.: US 11,605,675 B2
(45) Date of Patent: Mar. 14, 2023

(54) DISPLAY DEVICE, MASK ASSEMBLY, AND APPARATUS AND METHOD OF MANUFACTURING THE DISPLAY DEVICE

(71) Applicant: Samsung Display Co., Ltd., Yongin-si (KR)

(72) Inventors: Sangshin Lee, Yongin-si (KR); Jongbum Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/737,637

(22) Filed: Jan. 8, 2020

(65) Prior Publication Data
US 2020/0286963 A1 Sep. 10, 2020

(30) Foreign Application Priority Data
Mar. 4, 2019 (KR) .......................... 10-2019-0024855

(51) Int. Cl.
*H01L 27/32* (2006.01)
*G09G 3/20* (2006.01)

(52) U.S. Cl.
CPC ....... *H01L 27/3216* (2013.01); *G09G 3/2003* (2013.01); *H01L 27/3218* (2013.01); *G09G 2300/0452* (2013.01); *G09G 2340/0464* (2013.01)

(58) Field of Classification Search
CPC .......... C23C 14/042; G09G 2300/0452; G09G 2340/0464; G09G 3/2003; H01L 27/3216; H01L 27/3218; H01L 51/0011
See application file for complete search history.

(56) References Cited

U.S. PATENT DOCUMENTS

| 6,950,115 B2 | 9/2005 | Brown Elliott |
| 7,755,652 B2 | 7/2010 | Credelle et al. |
| 9,013,098 B1 | 4/2015 | Kim et al. |
| 9,459,747 B2 * | 10/2016 | Donnelly .............. G06F 3/0412 |

(Continued)

FOREIGN PATENT DOCUMENTS

| CN | 206076238 U | 4/2017 |
| CN | 206322697 U | 7/2017 |

(Continued)

OTHER PUBLICATIONS

Kim Gun-Shik; Pixel arrangement of organic light emitting display device; Nov. 30, 2011; Samsung Mobile Display Corporation; CN 102262854 (A) paragraphs 27, 28, figure 1-5 Specification English.*

(Continued)

*Primary Examiner* — Prabodh M Dharia
(74) *Attorney, Agent, or Firm* — Lewis Roca Rothgerber Christie LLP

(57) ABSTRACT

A display device includes a first sub-pixel have a square form, a second sub-pixel positioned to face a first side or a second side of the first sub-pixel and having a rectangular form, and a third sub-pixel positioned to face the first side or the second side of the first sub-pixel spaced from the second sub-pixel and having a rectangular form, wherein the first side and the second side of the first sub-pixel come together at an angle, and wherein the first sub-pixel, the second sub-pixel, and the third sub-pixel are configured to emit lights of different colors.

92 Claims, 19 Drawing Sheets

(56) References Cited

U.S. PATENT DOCUMENTS

| | | | |
|---|---|---|---|
| 9,818,803 B2 | 11/2017 | Lee | |
| 9,935,155 B2 | 4/2018 | Huangfu et al. | |
| 9,993,335 B2* | 6/2018 | Deering | G02B 13/16 |
| 10,007,968 B2* | 6/2018 | Jo | G06T 7/13 |
| 10,043,433 B2 | 8/2018 | Sun | |
| 10,104,324 B2* | 10/2018 | Hirota | H04N 5/347 |
| 10,418,428 B2* | 9/2019 | Jung | H01L 27/326 |
| 10,563,301 B2 | 2/2020 | Hong | |
| 10,694,129 B2* | 6/2020 | Cote | H04N 5/365 |
| 11,081,531 B2 | 8/2021 | Cho | |
| 11,257,869 B2 | 2/2022 | Luo et al. | |
| 11,302,750 B2 | 4/2022 | Feng et al. | |
| 11,329,103 B2 | 5/2022 | Kim et al. | |
| 11,417,714 B2 | 8/2022 | Lee et al. | |
| 2005/0231447 A1 | 10/2005 | Hu et al. | |
| 2008/0231554 A1 | 9/2008 | Lee | |
| 2009/0121983 A1 | 5/2009 | Sung et al. | |
| 2011/0260952 A1 | 10/2011 | Hwang et al. | |
| 2011/0291549 A1* | 12/2011 | Kim | H01L 27/3218 |
| | | | 313/504 |
| 2012/0056531 A1 | 3/2012 | Park et al. | |
| 2012/0193515 A1* | 8/2012 | Agranov | G01S 3/782 |
| | | | 250/208.1 |
| 2013/0057521 A1 | 3/2013 | Kim | |
| 2014/0065293 A1 | 3/2014 | Kim et al. | |
| 2014/0071030 A1 | 3/2014 | Lee | |
| 2014/0197385 A1 | 7/2014 | Madigan | |
| 2014/0197396 A1 | 7/2014 | Madigan | |
| 2014/0198479 A1 | 7/2014 | Chao et al. | |
| 2014/0284570 A1 | 9/2014 | Jinta et al. | |
| 2014/0292622 A1 | 10/2014 | Lee | |
| 2015/0011033 A1 | 1/2015 | Ko | |
| 2015/0015465 A1* | 1/2015 | Gong | H01L 27/3218 |
| | | | 345/76 |
| 2015/0048322 A1 | 2/2015 | So et al. | |
| 2015/0070374 A1* | 3/2015 | Gong | G06T 11/001 |
| | | | 345/589 |
| 2015/0076455 A1 | 3/2015 | Mizusaki et al. | |
| 2015/0102297 A1 | 4/2015 | Lee | |
| 2015/0138463 A1 | 5/2015 | Jinta et al. | |
| 2015/0179713 A1 | 6/2015 | Lee et al. | |
| 2015/0214280 A1 | 7/2015 | Furuie | |
| 2015/0270317 A1 | 9/2015 | Lee et al. | |
| 2015/0311265 A1 | 10/2015 | Matsueda et al. | |
| 2015/0311268 A1 | 10/2015 | Cheng | |
| 2015/0380471 A1 | 12/2015 | Guo et al. | |
| 2016/0078807 A1 | 3/2016 | Sun et al. | |
| 2016/0126295 A1 | 5/2016 | Sato | |
| 2016/0141351 A1 | 5/2016 | You | |
| 2016/0155777 A1 | 6/2016 | Kabe et al. | |
| 2016/0203748 A1* | 7/2016 | Matsueda | G09G 3/2003 |
| | | | 345/694 |
| 2016/0225833 A1 | 8/2016 | Kim | |
| 2016/0225834 A1 | 8/2016 | Kim et al. | |
| 2016/0247441 A1* | 8/2016 | Matsueda | G09G 3/2003 |
| 2016/0253972 A1 | 9/2016 | Bai et al. | |
| 2016/0254327 A1 | 9/2016 | Bai et al. | |
| 2016/0276615 A1 | 9/2016 | Kitabayashi | |
| 2016/0284290 A1* | 9/2016 | Tamaki | G09G 3/3614 |
| 2016/0284769 A1 | 9/2016 | Chien et al. | |
| 2016/0293678 A1* | 10/2016 | Wang | H01L 27/12 |
| 2016/0293899 A1* | 10/2016 | Hong | C23C 14/042 |
| 2016/0322432 A1* | 11/2016 | Yang | G09G 3/3208 |
| 2016/0323566 A1* | 11/2016 | Vdovin | H04N 13/305 |
| 2016/0329385 A1* | 11/2016 | Qiu | H01L 27/3218 |
| 2016/0351116 A1* | 12/2016 | Sun | H01L 27/3216 |
| 2017/0003495 A1* | 1/2017 | De Greef | G02B 26/005 |
| 2017/0003496 A1* | 1/2017 | De Greef | G02B 26/005 |
| 2017/0004780 A1* | 1/2017 | De Greef | G09G 3/348 |
| 2017/0009971 A1* | 1/2017 | Chan | H05K 1/181 |
| 2017/0052643 A1* | 2/2017 | Iwami | G06F 3/0412 |
| 2017/0104040 A1 | 4/2017 | Huangfu et al. | |
| 2017/0125486 A1 | 5/2017 | Chen | |
| 2017/0133440 A1 | 5/2017 | Wang et al. | |
| 2017/0134650 A1* | 5/2017 | Seger | H04N 5/2258 |
| 2017/0148990 A1* | 5/2017 | Ha | H01L 51/56 |
| 2017/0170200 A1* | 6/2017 | Ikeda | G09G 3/3233 |
| 2017/0179202 A1 | 6/2017 | Choi et al. | |
| 2017/0200778 A1 | 7/2017 | Jeon et al. | |
| 2017/0207285 A1 | 7/2017 | You et al. | |
| 2017/0250208 A1 | 8/2017 | Kim | |
| 2017/0269413 A1* | 9/2017 | Tamaki | G02F 1/13306 |
| 2017/0317150 A1* | 11/2017 | Chung | H01L 27/3276 |
| 2017/0324917 A1* | 11/2017 | Mlinar | H04N 5/369 |
| 2017/0369983 A1 | 12/2017 | Yi | |
| 2018/0005561 A1 | 1/2018 | Moon et al. | |
| 2018/0007324 A1* | 1/2018 | Chen | H04N 5/2252 |
| 2018/0018047 A1* | 1/2018 | Iwami | G06F 3/0412 |
| 2018/0045968 A1* | 2/2018 | Wu | G02B 27/42 |
| 2018/0045971 A1* | 2/2018 | Wu | G02B 30/30 |
| 2018/0062079 A1 | 3/2018 | Ko et al. | |
| 2018/0097038 A1 | 4/2018 | Lee et al. | |
| 2018/0122332 A1* | 5/2018 | Ikeda | G02F 1/16755 |
| 2018/0143358 A1* | 5/2018 | Kawashita | G02B 5/18 |
| 2018/0158882 A1* | 6/2018 | Kim | G09G 3/3291 |
| 2018/0158889 A1 | 6/2018 | Kim | |
| 2018/0166512 A1 | 6/2018 | Hack et al. | |
| 2018/0190731 A1 | 7/2018 | Park et al. | |
| 2018/0205040 A1 | 7/2018 | Kim et al. | |
| 2018/0210277 A1 | 7/2018 | Wang et al. | |
| 2018/0247984 A1 | 8/2018 | Wang et al. | |
| 2018/0261797 A1 | 9/2018 | Lee | |
| 2018/0269245 A1* | 9/2018 | Mlinar | H04N 9/04 |
| 2018/0302597 A1* | 10/2018 | Honda | H01L 27/14645 |
| 2018/0308915 A1 | 10/2018 | Motoyama et al. | |
| 2018/0312957 A1* | 11/2018 | Zhang | C23C 14/044 |
| 2019/0074329 A1 | 3/2019 | Kim et al. | |
| 2019/0084986 A1 | 3/2019 | Ye et al. | |
| 2019/0131333 A1* | 5/2019 | Borthakur | H01L 27/14623 |
| 2019/0206313 A1* | 7/2019 | Xia | H01L 27/3218 |
| 2019/0206950 A1 | 7/2019 | Chen | |
| 2019/0206951 A1* | 7/2019 | Xin | H01L 51/56 |
| 2019/0237520 A1* | 8/2019 | Tian | H01L 27/3218 |
| 2019/0252469 A1 | 8/2019 | Xiao et al. | |
| 2019/0271878 A1* | 9/2019 | Tsuruda | G02F 1/1335 |
| 2019/0296093 A1* | 9/2019 | Liu | H01L 27/3218 |
| 2019/0299336 A1* | 10/2019 | Nashner | H04M 1/0202 |
| 2019/0302336 A1* | 10/2019 | Fattal | G02B 6/0035 |
| 2019/0302919 A1* | 10/2019 | Clark | G06F 3/044 |
| 2019/0333418 A1* | 10/2019 | Kawashita | B29C 59/02 |
| 2019/0339452 A1* | 11/2019 | Fattal | G02B 26/0808 |
| 2019/0340970 A1* | 11/2019 | Kirisken | H01L 27/32 |
| 2019/0355794 A1 | 11/2019 | Dai et al. | |
| 2019/0355795 A1* | 11/2019 | Liu | H01L 27/3216 |
| 2019/0378882 A1 | 12/2019 | Zhang | |
| 2020/0020676 A1* | 1/2020 | Cok | H01L 25/06555 |
| 2020/0043989 A1* | 2/2020 | Liu | H01L 51/56 |
| 2020/0043990 A1* | 2/2020 | Huangfu | G01L 27/3246 |
| 2020/0045953 A1* | 2/2020 | Serrat | G06K 9/627 |
| 2020/0058713 A1* | 2/2020 | Zhang | C23C 14/042 |
| 2020/0135123 A1* | 4/2020 | Hu | G02F 1/1368 |
| 2020/0161352 A1* | 5/2020 | Takahashi | H01L 27/14623 |
| 2020/0168674 A1* | 5/2020 | Tan | H01L 27/3218 |
| 2020/0227489 A1 | 7/2020 | Kim et al. | |
| 2020/0235173 A1 | 7/2020 | Nakamura | |
| 2020/0235174 A1 | 7/2020 | Nakamura et al. | |
| 2020/0258441 A1* | 8/2020 | Zhang | G09G 3/2003 |
| 2020/0270739 A1* | 8/2020 | Jin | C23C 14/24 |
| 2020/0273924 A1 | 8/2020 | Xiao et al. | |
| 2020/0279894 A1 | 9/2020 | Madigan | |
| 2020/0286963 A1* | 9/2020 | Lee | H01L 27/3218 |
| 2020/0321407 A1* | 10/2020 | Tang | H01L 51/56 |
| 2020/0335717 A1 | 10/2020 | Kim et al. | |
| 2020/0350375 A1 | 11/2020 | Zhu et al. | |
| 2020/0357322 A1 | 11/2020 | Wu et al. | |
| 2020/0357861 A1 | 11/2020 | Wang et al. | |
| 2020/0357862 A1 | 11/2020 | Wang et al. | |
| 2020/0363905 A1 | 11/2020 | Jo et al. | |
| 2020/0381492 A1 | 12/2020 | Ryu et al. | |
| 2021/0026209 A1* | 1/2021 | Shin | G02F 1/133514 |
| 2021/0036066 A1* | 2/2021 | Luo | H01L 27/3216 |
| 2021/0050388 A1* | 2/2021 | Song | H01L 27/3272 |
| 2021/0066648 A1 | 3/2021 | Chung et al. | |

(56) References Cited

U.S. PATENT DOCUMENTS

| | | | |
|---|---|---|---|
| 2021/0067703 A1* | 3/2021 | Kadambala | H04N 5/232122 |
| 2021/0080637 A1* | 3/2021 | Brick | G02B 26/105 |
| 2021/0083025 A1 | 3/2021 | Nakao et al. | |
| 2021/0091151 A1* | 3/2021 | Lee | H01L 27/3246 |
| 2021/0104578 A1 | 4/2021 | Jo et al. | |
| 2021/0116801 A1* | 4/2021 | Ji | H01L 27/3216 |
| 2021/0134769 A1* | 5/2021 | Kam | H01L 25/167 |
| 2021/0135149 A1 | 5/2021 | Xin et al. | |
| 2021/0143201 A1* | 5/2021 | Woehler | H01L 27/14621 |
| 2021/0143222 A1* | 5/2021 | Song | H01L 27/3248 |
| 2021/0143230 A1* | 5/2021 | Wang | H01L 27/32 |
| 2021/0176492 A1* | 6/2021 | Kim | H04N 19/176 |
| 2021/0191549 A1* | 6/2021 | Kim | G06F 3/04164 |
| 2021/0200386 A1 | 7/2021 | Park | |
| 2021/0202653 A1* | 7/2021 | Cho | H01L 27/3246 |
| 2021/0225953 A1 | 7/2021 | Luo et al. | |
| 2021/0241671 A1 | 8/2021 | Lee et al. | |
| 2021/0255476 A1* | 8/2021 | Fattal | G02B 5/201 |
| 2021/0264823 A1* | 8/2021 | Heo | H01L 27/323 |
| 2022/0262871 A1 | 8/2022 | Kim et al. | |

FOREIGN PATENT DOCUMENTS

| | | |
|---|---|---|
| CN | 104992959 B | 2/2018 |
| CN | 207966982 U | 10/2018 |
| EP | 2940752 A1 | 11/2015 |
| EP | 3706177 A1 | 9/2020 |
| KR | 10-2013-0044993 A | 5/2013 |
| KR | 10-2014-0035239 A | 3/2014 |
| KR | 10-2015-0053161 A | 5/2015 |
| KR | 10-2016-0117846 A | 10/2016 |
| KR | 10-2017-0038294 A | 4/2017 |
| KR | 10-1898366 B1 | 9/2018 |

OTHER PUBLICATIONS

Kim Gun-Shik; Pixel arrangement of organic light emitting display device; Nov. 30, 2011; Samsung Mobiel Display Corporation; CN 102262854 (A) paragraphs 27, 28, figure 1-5 Drawings.*

Kim Gun-Shikl Pxiel arrangement of organic light emitting display device; Nov. 30,, 2011; Samsung Mobile Display Corporation; CN 102252854 (A) paragraphs 27, 28, figure 1-5 Specification Chinese.*

EPO Extended European search report dated Aug. 7, 2020, issued in corresponding European Patent Application No. 20159722.6 (15 pages).

European Search Report dated Jul. 6, 2021 issued in EP Application No. 20212999.5, 18 pages.

Search Opinion, European Patent Office, EPO App. No. 20212999.5, dated Jul. 6, 2021, all pages (Year: 2021).

Partial European Search Report, European Patent Office, EPO App. No. 20212999.5, dated Jul. 6, 2021, all pages (Year: 2021).

U.S. Office Action dated Sep. 16, 2021, issued in U.S. Appl. No. 16/899,394 (46 pages).

U.S. Notice of Allowance from U.S. Appl. No. 16/899,394, dated Feb. 1, 2022, 11 pages.

U.S. Corrected Notice of Allowability from U.S. Appl. No. 16/899,394, dated Feb. 18, 2022, 9 pages.

U.S. Notice of Allowance dated Sep. 14, 2022, issued in U.S. Appl. No. 16/899,394 (13 pages).

Notice of Allowance dated May 16, 2022, for related U.S. Appl. No. 16/899,394 (12 pages).

U.S. Notice of Allowance dated Aug. 9, 2022, issued in U.S. Appl. No. 17/492,183 (12 pages).

U.S. Notice of Allowance dated Nov. 23, 2022, issued in U.S. Appl. No. 17/492,183 (8 pages).

* cited by examiner

DISPLAY DEVICE, MASK ASSEMBLY, AND APPARATUS AND METHOD OF MANUFACTURING THE DISPLAY DEVICE

CROSS-REFERENCE TO RELATED APPLICATION

This application claims priority to and the benefit of Korean Patent Application No. 10-2019-0024855, filed on Mar. 4, 2019, in the Korean Intellectual Property Office, the disclosure of which is incorporated herein in its entirety by reference.

BACKGROUND

1. Field

Aspects of the present invention are related to a display device, a mask assembly, and an apparatus and method of manufacturing the display device.

2. Description of the Related Art

Mobility based electronic devices have a wide range of uses. Recently, tablet personal computers (PCs) have been used as mobile electronic devices, in addition to small electronic devices such as mobile phones.

The mobile electronic device includes a display device for providing visual information such as images or moving images to users in order to support various functions. As components for driving the display device have recently become smaller, a portion of the display device that occupies an electronic device has increased, and a structure of the display device that may be bent to have a predetermined angle from a flat state has been developed.

SUMMARY

When a conventional display device is disposed in a vehicle or the like, glare may occur due to external light reflection or the like in the display device. In addition, in an apparatus for manufacturing the conventional display device and a method of manufacturing the display device, a deposition material is deposited on a substrate in a pattern different from the design because deformation of a mask sheet at the time of extension according to a pattern of an opening portion is out of an expected range. One or more embodiments include a display device having a precise pattern while minimizing or substantially reducing external light reflection, apparatus and method of manufacturing the display device. However, embodiments are not limited thereto.

Additional aspects will be set forth in part in the description which follows and, in part, will be apparent from the description, or may be learned by practice of the presented embodiments.

According to some embodiments, there is provided a display device including: a first sub-pixel have a square form; a second sub-pixel positioned to face a first side or a second side of the first sub-pixel and having a rectangular form; and a third sub-pixel positioned to face the first side or the second side of the first sub-pixel spaced from the second sub-pixel and having a rectangular form, wherein the first side and the second side of the first sub-pixel come together at an angle, and wherein the first sub-pixel, the second sub-pixel, and the third sub-pixel are configured to emit lights of different colors.

In some embodiments, at least a portion of the second sub-pixel and at least a portion of the third sub-pixel are within a length range of one of the first side and the second side of the first sub-pixel.

In some embodiments, a short side of the second sub-pixel is parallel to the first side or the second side of the first sub-pixel.

In some embodiments, a short side of the third sub-pixel is parallel to the first side or the second side of the first sub-pixel.

In some embodiments, the display device further includes a plurality of first sub-pixels including the first sub-pixel, and centers of the first sub-pixels are on a straight line.

In some embodiments, the display device further includes: a plurality of second sub-pixels including the second sub-pixel; and a plurality of third sub-pixels including the third sub-pixel, wherein centers of some subpixels of the plurality of second sub-pixels or the plurality of third sub-pixels are on a straight line in one direction.

In some embodiments, the display device further includes a plurality of second sub-pixels including the second sub-pixel; and a plurality of third sub-pixels including the third sub-pixel, wherein centers of some subpixels of the plurality of second sub-pixels or the plurality of third sub-pixels are on a serpentine line in one direction.

In some embodiments, a plurality of first sub-pixels are arranged in a first direction, and the second sub-pixel faces the first side of the first sub-pixel, the second sub-pixel or the third sub-pixel faces the second side of the first sub-pixel, and the second sub-pixel and the third sub-pixel are arranged to be symmetrical about a straight line connecting centers of the first sub-pixels in the first direction.

In some embodiments, a first distance that is a shortest distance from an edge of the first sub-pixel to the second sub-pixel and a second distance that is a shortest distance from the edge of the first sub-pixel to the third sub-pixel are approximately equal to each other.

In some embodiments, a first distance that is a shortest distance from an edge of the first sub-pixel to the second sub-pixel and a second distance that is a shortest distance from the edge of the first sub-pixel to the third sub-pixel are different from each other.

In some embodiments, the display device further includes: a plurality of second sub-pixels including the second sub-pixel; and a plurality of third sub-pixels including the third sub-pixel, wherein shortest distances of respective second sub-pixels arranged to face the first sub-pixel from an edge of the first sub-pixel to other second sub-pixels are different from each other, and wherein shortest distances of respective third sub-pixels arranged to face the first sub-pixel from the edge of the first sub-pixel to other third sub-pixels are different from each other.

In some embodiments, a plurality of first sub-pixels are arranged in a first direction, and a long side of the second sub-pixel or a long side of the third sub-pixel forms an angle of 45 degrees with respect to a straight line connecting centers of the first sub-pixels in the first direction.

In some embodiments, an area of the first sub-pixel is greater than at least one of an area of the second sub-pixel and an area of the third sub-pixel.

In some embodiments, an area of the second sub-pixel is different from an area of the third sub-pixel.

In some embodiments, an outline connecting a portion of an edge of the second sub-pixel and a portion of an edge of the third sub-pixel is square.

In some embodiments, a vertex of at least one of the first sub-pixel, the second sub-pixel, and the third sub-pixel is chamfered.

In some embodiments, the first sub-pixel is configured to emit blue light, one of the second sub-pixel and the third sub-pixel is configured to emit red light, and an other of the second sub-pixel and the third sub-pixel is configured to emit green light.

In some embodiments, the display device further includes: a pixel-defining layer defining an area of at least one of the first sub-pixel, the second sub-pixel, and the third sub-pixel; and a spacer protruding from the pixel-defining layer.

According to some embodiments, there is provided a display device including: a plurality of first intermediate layers arranged in a square shape and spaced from each other; and a plurality of second intermediate layers arranged to face the first intermediate layers; and a plurality of third intermediate layers spaced from the second intermediate layers and arranged in a rectangular shape and spaced from each other, wherein the plurality of second intermediate layers are arranged such that an extension line of a long side of one of the plurality of second intermediate layers and an extension line of a long side of another one of the plurality of second intermediate layers cross each other, and wherein the first intermediate layers, the second intermediate layers, and the third intermediate layers include materials configured to emit lights of different colors when power is applied to the first intermediate layers, the second intermediate layers, and the third intermediate layers.

In some embodiments, the plurality of third intermediate layers are arranged such that extension lines of a long side of a portion of the plurality of third intermediate layers and extension lines of a long side of another portion of the plurality of third intermediate layers cross each other.

In some embodiments, the second intermediate layers and the third intermediate layers are parallel to each other.

In some embodiments, centers of a portion of the plurality of second intermediate layers and a center of some of at least one of the plurality of third intermediate layers are on a straight line.

In some embodiments, in a second intermediate layer and a third intermediate layer facing a corresponding first intermediate layer among the plurality of first intermediate layers, a shortest distance from a straight line overlapping one side of the corresponding first intermediate layer facing the second intermediate layer and the third intermediate layer to a center of the second intermediate layer and a shortest distance from the straight line to a center of the third intermediate layer are approximately equal to each other.

In some embodiments, in a second intermediate layer and a third intermediate layer facing a corresponding first intermediate layer among the plurality of first intermediate layers, a shortest distance from a straight line overlapping one side of the corresponding first intermediate layer facing the second intermediate layer and the third intermediate layer to a center of the second intermediate layer and a shortest distance from the straight line to a center of the third intermediate layer are different from each other.

In some embodiments, shortest distances between respective second intermediate layers among the plurality of second intermediate layers and facing a corresponding first intermediate layers among the plurality of first intermediate layers and the corresponding first intermediate layers are different from each other.

According to some embodiments, there is provided a mask assembly including: a mask frame; and a plurality of mask sheets sequentially arranged along one side of the mask frame in an extended state above the mask frame, wherein each of the mask sheets includes a plurality of openings, and wherein some of the plurality of openings are tilted in a direction with respect to an extension direction of the mask sheet of the plurality of mask sheets and some other of the plurality of openings are tilted in a direction different from the direction of the some of the plurality of openings.

In some embodiments, each of the openings is formed at an angle of 45 degrees with respect to the extension direction of the mask sheet.

In some embodiments, centers of the some of the plurality of openings, which are arranged in the extension direction of the mask sheet, are on a line.

In some embodiments, centers of the some other of the plurality of openings, which are arranged in a direction perpendicular to the extension direction of the mask sheet, are on a serpentine line.

In some embodiments, each of the openings is rectangular.

In some embodiments, a vertex of each of the openings is chamfered.

According to some embodiments, there is provided a display device manufacturing apparatus including: a chamber in which a display substrate is positioned; a deposition source inside the chamber and supplying a deposition material into the chamber; and a mask assembly positioned to face the deposition source and allowing the deposition material to pass therethrough in a pattern form, wherein the mask assembly includes: a mask frame; and a plurality of mask sheets sequentially arranged along one side of the mask frame in an extended state above the mask frame, wherein each of the mask sheets includes a plurality of openings, and wherein some of the plurality of openings are tilted in a direction with respect to an extension direction of the mask sheet of the plurality of mask sheets and some other of the plurality of openings are tilted in a direction different from the direction of the some of the plurality of openings.

In some embodiments, each of the openings is formed at an angle of 45 degrees with respect to the extension direction.

In some embodiments, centers of the openings, which are arranged in the extension direction of the mask sheet, are on a line.

In some embodiments, centers of the some other of the plurality of openings, which are arranged in a direction perpendicular to the extension direction of the mask sheet, are on a serpentine line.

In some embodiments, each of the openings is rectangular.

In some embodiments, a vertex of each of the openings is chamfered.

According to some embodiments, there is provided a display device manufacturing apparatus including: a first deposition unit configured to form a plurality of first intermediate layers above a display substrate; a second deposition unit connected to the first deposition unit and configured to deposit a plurality of second intermediate layers on the display substrate; and a third deposition unit connected to the second deposition unit and configured to deposit a plurality of third intermediate layers on the display substrate, wherein one of the first intermediate layers, the second intermediate layers, and the third intermediate layers are square, and a remaining two of them are rectangular, and wherein two of the first intermediate layers, the second intermediate layers, and the third intermediate layers are positioned so as to face a remaining one of the first intermediate layers, the second intermediate layers, and the third intermediate layers, and two of the first intermediate layers, the second intermediate layers, and the third intermediate layers are parallel to each other.

In some embodiments, the first intermediate layers, the second intermediate layers, and the third intermediate layers include different organic emission layers.

In some embodiments, some of the plurality of first intermediate layers, the plurality of second intermediate layers, or the plurality of third intermediate layers, which are square, are on a straight line in a first direction, and some of a remaining two of the plurality of first intermediate layers, the plurality of second intermediate layers, and the plurality of third intermediate layers, which are rectangular, and another portion of one of the plurality of first intermediate layers, the plurality of second intermediate layers, and the plurality of third intermediate layers, which are rectangular, are tilted in different directions with respect to the first direction.

In some embodiments, centers of some of one of the remaining two of the plurality of first intermediate layers, the plurality of second intermediate layers, and the plurality of third intermediate layers, which are square, are on a straight line or on a serpentine line.

In some embodiments, an outline connecting edges of two of the plurality of first intermediate layers, the plurality of second intermediate layers, and the plurality of third intermediate layers arranged in a rectangular shape and adjacent to each other is square.

In some embodiments, each of the first intermediate layers forms a first sub-pixel, each of the second intermediate layers forms a second sub-pixel, and each of the third intermediate layers forms a third sub-pixel, and an area of one of remaining two of a plurality of first sub-pixels, a plurality of second sub-pixels, and a plurality of third sub-pixels, which are rectangular, and an other area of one of remaining two of the plurality of first sub-pixels, the plurality of second sub-pixels, and the plurality of third sub-pixels which are rectangular are different from each other.

In some embodiments, a vertex of at least one of each of the first intermediate layers, each of the second intermediate layers, and each of the third intermediate layers is chamfered.

In some embodiments, the first deposition unit includes a first mask assembly including a first mask sheet having a plurality of first openings corresponding to each of the first intermediate layers, the second deposition unit includes a second mask assembly including a second mask sheet having a plurality of second openings corresponding to each of the second intermediate layers, and the third deposition unit includes a third mask assembly including a third mask sheet having a plurality of third openings corresponding to each of the third intermediate layers.

In some embodiments, a vertex of at least one of each of the first intermediate layers, each of the second intermediate layers, and each of the third intermediate layers is chamfered.

In some embodiments, two of the first openings, the second openings, and the third openings are arranged in a state of being tilted with respect to an extension direction of one of the first mask sheet, the second mask sheet, and the third mask sheet.

According to some embodiments, there is provided a display device manufacturing method including: depositing a first deposition material above a display substrate and forming a plurality of first intermediate layers; depositing a second deposition material on the display substrate and forming a plurality of second intermediate layers; and depositing a third deposition material on the display substrate and depositing a plurality of third intermediate layers, wherein one of each of the first intermediate layers, each of the second intermediate layer, and each of the third intermediate layer is square, and a remaining two of them are rectangular, and wherein a remaining two of each of the first intermediate layers, each of the second intermediate layers, and each of the third intermediate layers that are rectangular are arranged to face one side of the one of each of the first intermediate layers, each of the second intermediate layers, and each of the third intermediate layers.

In some embodiments, centers of some other of the remaining two of the plurality of first intermediate layers, the plurality of second intermediate layers, and the plurality of third intermediate layers, which are rectangular, are on a straight line in one direction or on a serpentine line.

In some embodiments, centers of some other of the remaining two of the plurality of first intermediate layers, the plurality of second intermediate layers, and the plurality of third intermediate layers, which are rectangular, are on a straight line in one direction or on a serpentine line.

In some embodiments, one of the remaining two of the plurality of first intermediate layers, the plurality of second intermediate layers, and the plurality of third intermediate layers, which are square, are positioned to be symmetrical about a straight line passing through a center of one of each of the first intermediate layers, each of the second intermediate layers, and each of the third intermediate layers, which are square.

In some embodiments, one of the remaining two of the plurality of first intermediate layers, the plurality of second intermediate layers, and the plurality of third intermediate layers, which are rectangular, are positioned to be symmetrical about a straight line passing through a center of one of each of the first intermediate layers, each of the second intermediate layers, and each of the third intermediate layers, which are square.

In some embodiments, the remaining two of each of the first intermediate layers, each of the second intermediate layers, and each of the third intermediate layers, which are rectangular, and face one of each of the first intermediate layers, each of the second intermediate layers, and each of the third intermediate layers, which are square, have different shortest distances from one side or an extension line of the one side of the one of each of the first intermediate layers, each of the second intermediate layers, and each of the third intermediate layers, which are square, to each of the remaining two of each of the first intermediate layers, each of the second intermediate layers, and each of the third intermediate layers.

In some embodiments, one of each of the first intermediate layers, each of the second intermediate layers, and each of the third intermediate layers that face one of each of the first intermediate layers, each of the second intermediate layers, and each of the third intermediate layers, which are square, has a shortest distance from one side or an extension line of the one side of the one of each of the first intermediate layers, each of the second intermediate layers, and each of the third intermediate layers, which are square, a shortest distance different from one of each of the first intermediate layers, each of the second intermediate layers, and each of the third intermediate layers which are rectangular to face one of each of the first intermediate layers, each of the second intermediate layers, and each of the third intermediate layers, which are square.

In some embodiments, the first intermediate layers are square, and the second intermediate layers and the third intermediate layers are rectangular.

In some embodiments, the first deposition material, the second deposition material, and the third deposition material include different organic light-emitting materials.

In some embodiments, at least one of the first intermediate layers, the second intermediate layers, and the third intermediate layers have a chamfered vertex.

In some embodiments, an outline connecting a portion of an edge of one of the remaining two of the plurality of first intermediate layers, the plurality of second intermediate layers, and the plurality of third intermediate layers, which are rectangular and adjacent to each other, to a portion of an edge of the other of the remaining two of the plurality of first intermediate layers, the plurality of second intermediate layers, and the plurality of third intermediate layers, which are rectangular, is square.

In some embodiments, each of the first intermediate layers forms a first sub-pixel, each of the second intermediate layers forms a second sub-pixel, and each of the third intermediate layers form a third sub-pixel, and wherein an area of one of remaining two of a plurality of first sub-pixels, a plurality of second sub-pixels, and a plurality of third sub-pixels, which are rectangular, and an other area of one of remaining two of the plurality of first sub-pixels, the plurality of second sub-pixels, and the plurality of third sub-pixels which are rectangular are different from each other.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
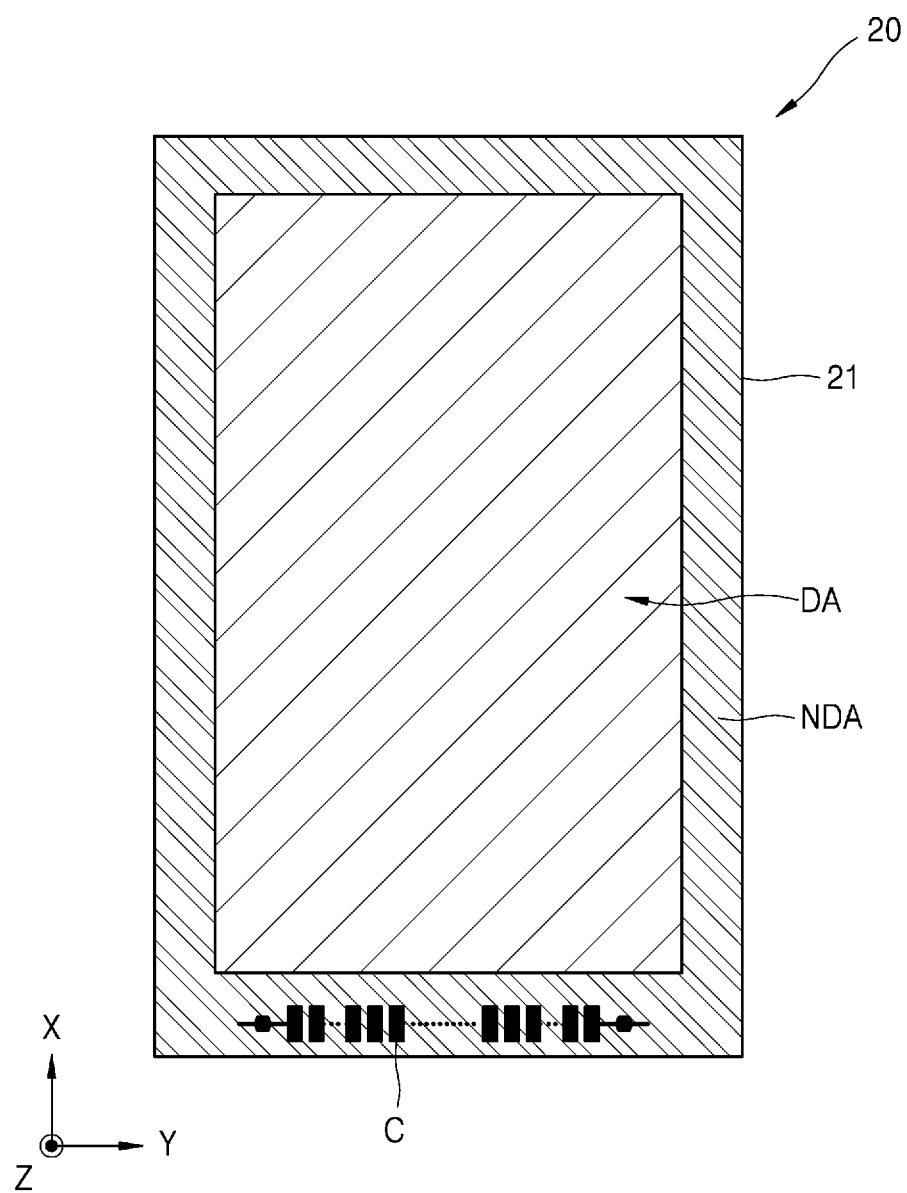
FIG. 1 is a plan view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Sizes of components in the drawings may be exaggerated for convenience of explanation. In other words, since sizes and thicknesses of components in the drawings are arbitrarily illustrated for convenience of explanation, the following embodiments are not limited thereto.

Furthermore, an X-axis, a Y-axis, and a Z-axis are not limited to three axes on an orthogonal coordinate system and may be widely understood. For example, the X-axis, the Y-axis, and the Z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
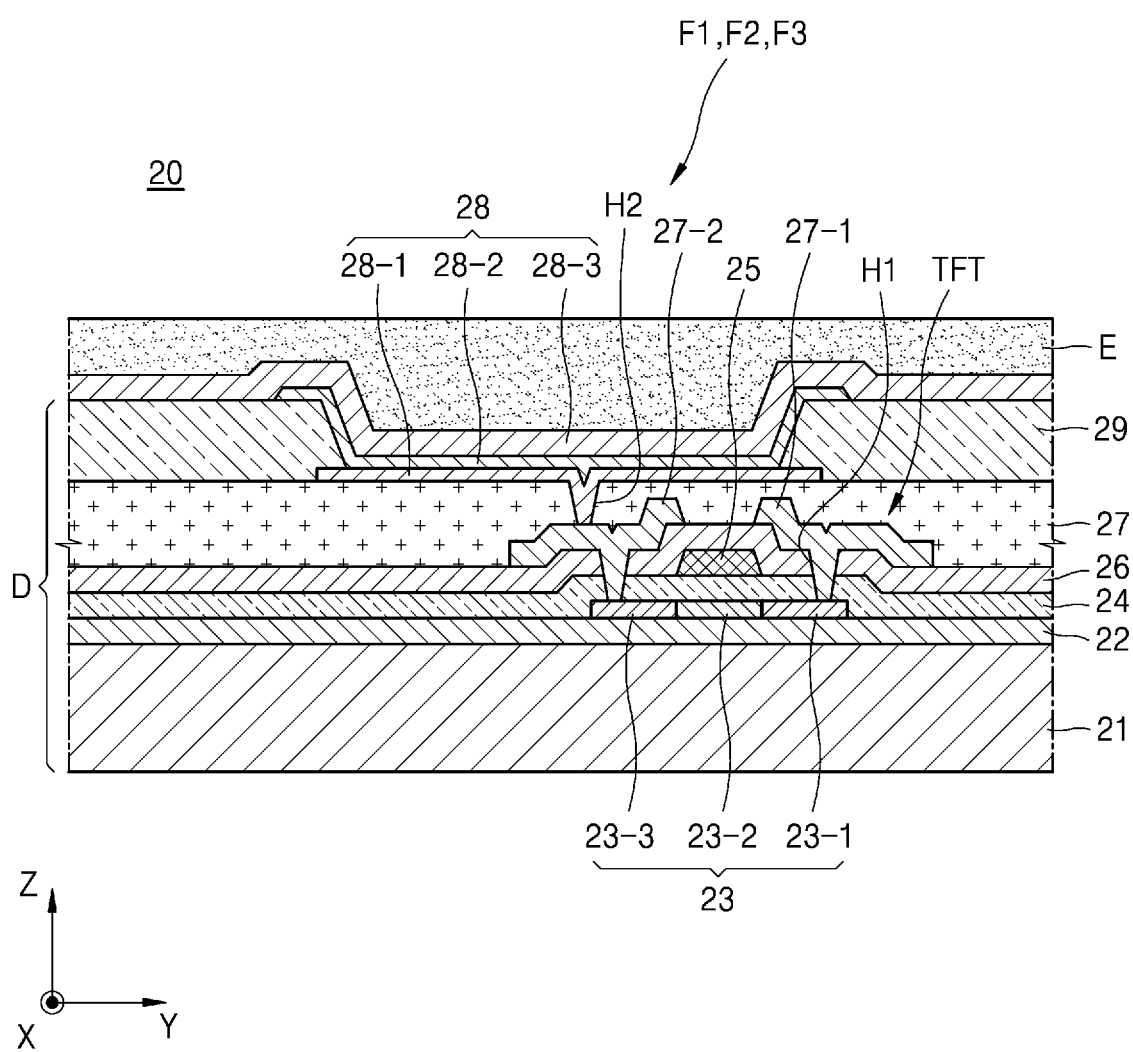
FIG. 2 is a cross-sectional view of a sub-pixel portion of the display device shown in FIG. 1.
Figure 3:
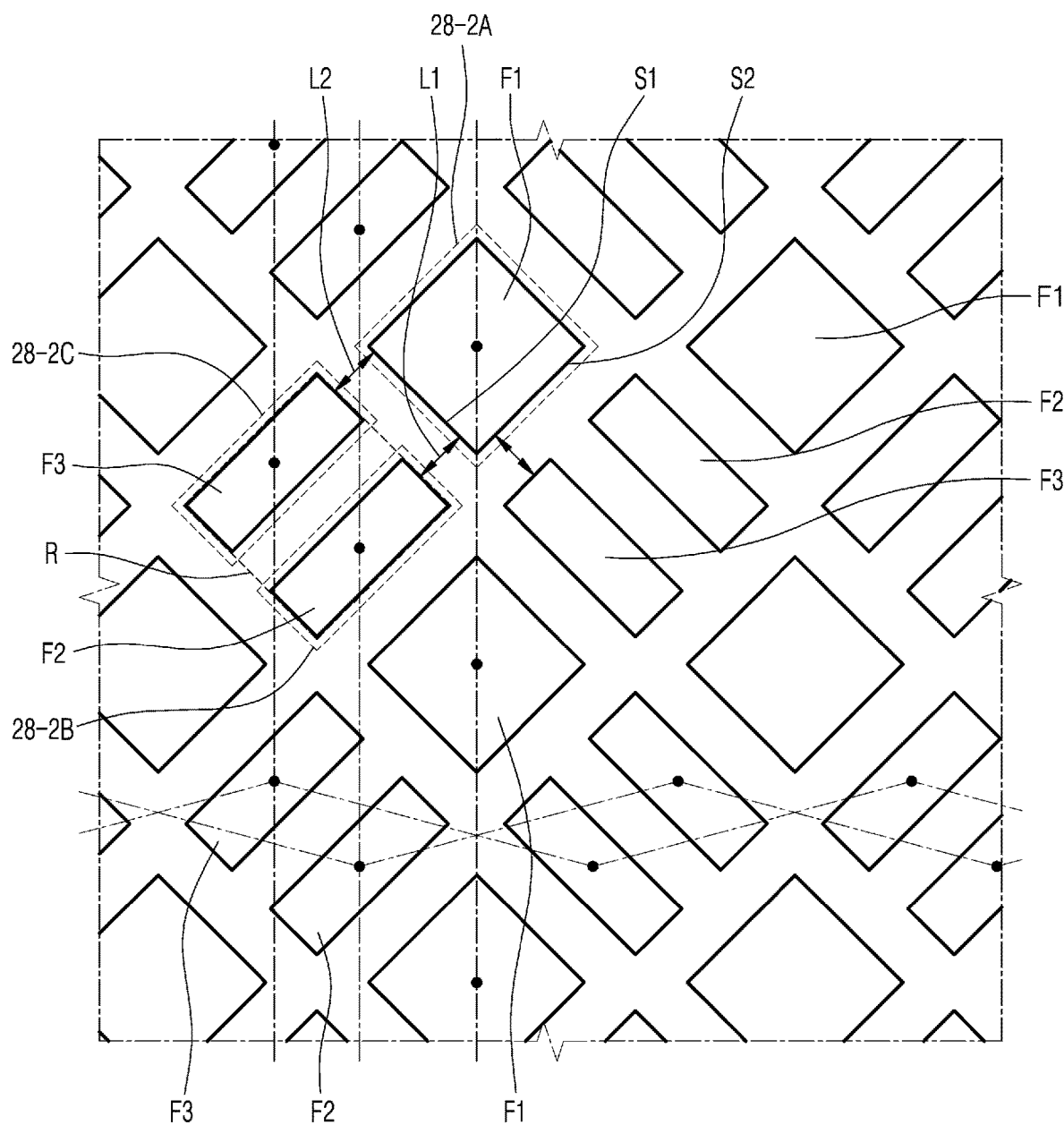
FIG. 3 is a plan view of a first sub-pixel, a second sub-pixel, and a third sub-pixel of the display device shown in FIG. 1.

FIG. 1 is a plan view of a display device according to an embodiment. FIG. 2 is a cross-sectional view of a sub-pixel portion of the display device shown in FIG. 1. FIG. 3 is a plan view of a first sub-pixel, a second sub-pixel, and a third sub-pixel of the display device shown in FIG. 1.

Referring to FIGS. 1 and 3, a display device 20 may define a display area DA on a substrate 21 and a non-display area NDA in a contour of the display area DA. A light-emitting area may be in the display area DA, and a power wire may be in the non-display area NDA. Furthermore, a pad area C may be arranged in the non-display area NDA.

In such a case, the display area DA may have various suitable shapes. For example, the display area DA may have a shape such as a rectangle, a square, or a circle. In addition, the display area DA may have an irregular shape. However, for convenience of description, a case where the display area DA has a rectangular shape will be described in detail later below.

The display device 20 may include a display substrate D and a thin-film encapsulation layer E. The display device 20 may include the substrate 21, a thin-film transistor TFT, a passivation film 27, and a pixel electrode 28-1. As another embodiment, the display substrate D may include some of the substrate 21, the thin-film transistor TFT, the passivation film 27, the pixel electrode 28-1, and an intermediate layer 28-2.

The substrate 21 may include a plastic material, or a metal material such as stainless steel (SUS) or titanium. The substrate 21 may include polyimide (PI). For convenience of description, a case where the substrate 21 is formed of PI will be mainly described in detail later below.

The thin-film transistor TFT may be formed on the substrate 21, the passivation film 27 may be formed to cover the thin-film transistor TFT, and an organic light-emitting device (OLED) 28 may be formed on the passivation film 27.

The buffer layer 22 formed of an organic compound and/or an inorganic compound (e.g., SiOx (x≤1) or SiNx (x≤1)) may be further formed on a top surface of the substrate 21.

After the active layer 23 that is arranged to have a predetermined pattern is formed on the buffer layer 22, the active layer 23 may be covered by the gate insulating layer 24. The active layer 23 includes the source region 23-1 and the drain region 23-3, and further includes the channel region 23-2 therebetween.

The active layer 23 may include various suitable materials. For example, the active layer 23 may include an inorganic semiconductor material such as amorphous silicon or crystalline silicon. As another example, the active layer 23 may include an oxide semiconductor. As another example, the active layer 23 may include an organic semiconductor material. However, for convenience of description, a case where the active layer 23 is formed of amorphous silicon will be described in detail later below.

The active layer 23 may be formed by forming an amorphous silicon film on the buffer layer 22, crystallizing the amorphous silicon film into a polycrystalline silicon film, and patterning the polycrystalline silicon film. The source region 23-1 and the drain region 23-3 of the active layer 23 may be doped with impurities according to a type of the thin-film transistor (TFT) such as a driving TFT or a switching TFT.

A gate electrode 25 that corresponds to the active layer 23 and an interlayer insulating layer 26 that covers the gate electrode 25 may be formed on a top surface of the gate insulating layer 24.

After the contact hole (or contact opening) H1 is formed in the interlayer insulating layer 26 and the gate insulating layer 24, a source electrode 27-1 and a drain electrode 27-2 may be formed on the interlayer insulating layer 26 to respectively contact the source region 23-1 and the drain region 23-3.

The passivation film 27 may be formed on the thin-film transistor TFT. The pixel electrode 28-1 of the OLED 28 may be formed on the passivation film 27. The pixel electrode 28-1 may contact the drain electrode 27-2 of the thin-film transistor TFT through the via hole H2 that is formed in the passivation film 27. The passivation film 27 may be formed of an inorganic material and/or an organic material to have a single-layer structure or a multi-layer structure. The passivation film 27 may be formed as a planarization film having a flat top surface regardless of a curved shape of a lower film that is disposed below the passivation film 27 or may be curved along the curved shape of the lower film. The passivation film 27 may be formed of a transparent insulator to achieve a resonance effect.

After the pixel electrode 28-1 is formed on the passivation film 27, a pixel-defining layer 29 may be formed of an organic material and/or an inorganic material to cover the pixel electrode 28-1 and the passivation film 27 and to allow the pixel electrode 28-1 to be exposed therethrough.

The intermediate layer 28-2 and an opposite electrode 28-3 may be formed on at least the pixel electrode 28-1. In another embodiment, the opposite electrode 28-3 may be formed on the entire surface of a display substrate D. The opposite electrode 28-3 may be formed on the intermediate layer 28-2 and the pixel-defining layer 29. Hereinafter, for convenience of description, a case where the opposite electrode 28-3 is formed on the intermediate layer 28-2 and the pixel-defining layer 29 will be mainly described in detail.

The pixel electrode 28-1 may function as an anode and the opposite electrode 28-3 may function as a cathode. Polarities of the pixel electrode 28-1 and the opposite electrode 28-3 may be switched.

The pixel electrode 28-1 and the opposite electrode 28-3 may be insulated from each other by the intermediate layer 28-2, and voltages of different polarities are applied to the intermediate layer 28-2 such that an organic emission layer emits light.

The intermediate layer 28-2 may include an organic emission layer. As another selective example, the intermediate layer 28-2 may include an organic emission layer and may further include at least one of a hole injection layer (HIL), a hole transporting layer (HTL), an electron transporting layer (ETL), and an electron injection layer (EIL). However, the present embodiment is not limited thereto. The intermediate layer 28-2 may include an organic emission layer and may further include various suitable functional layers.

A plurality of intermediate layers 28-2 may be provided and the plurality of intermediate layers 28-2 may form the display area DA. The plurality of intermediate layers 28-2 may be arranged to be spaced apart from each other in the display area DA.

One unit pixel may include a plurality of sub-pixels. The plurality of sub-pixels may emit light of various suitable colors. In an embodiment, one sub-pixel may be defined as a region in which light having one color is emitted. As another embodiment, one sub-pixel may be defined as a portion of the pixel electrode 28-1 that is exposed to the outside through an opened area of the pixel-defining layer 29. In this case, adjusting the size of one sub-pixel may be achieved by adjusting an area of the pixel electrode 28-1 exposed to the outside by adjusting the size of an opened area of the pixel-defining layer 29. Hereinafter, for convenience of description, one sub-pixel will be described in detail with reference to a case where light having one color is emitted.

The plurality of sub-pixels may include sub-pixels emitting red, green, and blue light. As another embodiment, the plurality of sub-pixels may include sub-pixels emitting red, green, blue, and white light. As another embodiment, the plurality of sub-pixels may include sub-pixels emitting red, yellow, and blue light. In this case, the plurality of sub-pixels are not limited to those described above, and may include all cases including sub-pixels emitting different colors. Hereinafter, for the sake of convenience of explanation, a case where a plurality of sub-pixels include sub-pixels emitting blue, red, and green light will be described in detail.

The plurality of sub-pixels may include a first sub-pixel F1, a second sub-pixel F2, and a third sub-pixel F3. Here, one of the first sub-pixel F1, the second sub-pixel F2, and the third sub-pixel F3 may be a square, and the other two may be rectangles. Hereinafter, for convenience of explanation, a case where the first sub-pixel F1 is a square, and the second sub-pixel F2 and the third sub-pixel F3 are rectangles will be mainly described in detail.

One of the first sub-pixel F1, the second sub-pixel F2, and the third sub-pixel F3 emits blue light, another one of the first sub-pixel F1, the second sub-pixel F2, and the third sub-pixel F3 emits red light, and the other of the first sub-pixel F1, the second sub-pixel F2, and the third sub-pixel F3 emits green light. In this case, depending on the shape of each of the first sub-pixel F1, the second sub-pixel F2, and the third sub-pixel F3, one of blue, red, and green lights may be square, and the remaining lights may be rectangles. Hereinafter, for convenience of explanation, a case where the first sub-pixel F1 emits blue light, the second sub-pixel F2 emits red light, and the third sub-pixel F3 emits green light will be mainly described in detail.

An area of each of the first sub-pixel F1, the second sub-pixel F2, and the third sub-pixel F3 may vary. In this case, since an aperture ratio of each of the sub-pixels may be adjusted, it is possible to realize the display device 20 capable of performing various suitable operations in various forms.

The first sub-pixel F1, the second sub-pixel F2, and the third sub-pixel F3, as described above, may include a first intermediate layer 28-2A, a second intermediate layer 28-2B, and a third intermediate layer 28-2C, respectively. In this case, the first intermediate layer 28-2A, the second intermediate layer 28-2B, and the third intermediate layer 28-2C may include materials (e.g., organic emission layers) that emit different lights when external power is applied.

The first intermediate layer 28-2A, the second intermediate layer 28-2B, and the third intermediate layer 28-2C may correspond to the shapes of the first sub-pixel F1, the second sub-pixel F2, and the third sub-pixel F3, respectively. For example, the first intermediate layer 28-2A may have a square shape corresponding to a square shape of the first sub-pixel F1. Furthermore, the second intermediate layer 28-2B and the third intermediate layer 28-2C may have rectangular shapes corresponding to rectangular shapes of the second sub-pixel F2 and the third sub-pixel F3, respectively. In this case, a planar area of each of the intermediate layers may be the same as or different from a planar area of each of the sub-pixels. For example, in an embodiment, a planar area of the first intermediate layer 28-2A may be different from a planar area of the first sub-pixel F1, a planar area of the second intermediate layer 28-2B may be the same as a planar area of the third sub-pixel F2, and a planar area of the third intermediate layer 28-2C may be the same as a planar area of the third sub-pixel F3. As another embodiment, a planar area of the second intermediate layer 28-2B may be different from a planar area of the second sub-pixel F2, a planar area of the first intermediate layer 28-2A may be the same as a planar area of the first sub-pixel F1, and a planar area of the third intermediate layer 28-2C may be the same as a planar area of the third sub-pixel F3. As another embodiment, a planar area of the third intermediate layer 28-2C may be different from a planar area of the third sub-pixel F3, the area on a plane of the second intermediate layer 28-2B may be the same as the area on a plane of the second sub-pixel F2, and the area on a plane of the first intermediate layer 28-2A may be the same as the area on a plane of the first sub-pixel F1. As another embodiment, the area on a plane of the first intermediate layer 28-2A may be the same as the area on a plane of the first sub-pixel F1, the area on a plane of the second intermediate layer 28-2B may be different from the area on a plane of the second sub-pixel F2, and the area on a plane of the third intermediate layer 28-2C may be different from the area on a plane of the third sub-pixel F3. As another embodiment, the area on a plane of the second intermediate layer 28-2B may be the same as the area on a plane of the second sub-pixel F2, the area on a plane of the first intermediate layer 28-2A may be different from the area on a plane of the first sub-pixel F1, and the area on a plane of the third intermediate layer 28-2C may be different from the area on a plane of the third sub-pixel F3. As another embodiment, the area on a plane of the third intermediate layer 28-2C may be the same as the area on a plane of the third sub-pixel F3, the area on a plane of the first intermediate layer 28-2A may be different from the area on a plane of the first sub-pixel F1, and the area on a plane of the second intermediate layer 28-2B may be different from a planar area of the second sub-pixel F2. As another embodiment, a planar area of the first intermediate layer 28-2A may be different from a planar area of the first sub-pixel F1, a planar area of the second intermediate layer 28-2B may be different from a planar area of the second sub-pixel F2, and a planar area of the third intermediate layer 28-2C may be different from a planar area of the third sub-pixel F3. As another embodiment, a planar area of the first intermediate layer 28-2A may be the same as a planar area of the first sub-pixel F1, a planar area of the second intermediate layer 28-2B may be the same as a planar area of the second sub-pixel F2, and a planar area of the third intermediate layer 28-2C may be the same as a planar area of the third sub-pixel F3. Here, a planar area may be an area on a plane formed by the display area DA of the display device 20. In some examples, a planar area may be an area on a plane on which an image is to be implemented when the image is implemented. Hereinafter, for convenience of explanation, a case where a planar area of each intermediate layer is different from a planar area of each sub-pixel will be mainly described in detail.

In such a case, a planar area of each sub-pixel may be less than a planar area of each intermediate layer. In particular, in this case, since each intermediate layer may be deposited on the display substrate D by deposition while providing a sufficient margin, light of an accurate shape may be emitted from each sub-pixel.

Since a relationship between the sub-pixels and a relationship between the sub-pixels are the same or similar to each other, the following description will be made mainly on the relationship between sub-pixels for convenience of explanation.

The first sub-pixel F1, the second sub-pixel F2, and the third sub-pixel F3 may be plural. A plurality of first sub-pixels F1 may be spaced apart from each other in at least one of a first direction and a second direction. For example, a portion of the plurality of first sub-pixels F1 may be arranged to be spaced apart from each other in a first direction (e.g., one of an X-axis direction and a Y-axis direction in FIG. 1), and another portion of the sub-pixels F1 may be arranged to be spaced apart from each other in a second direction (e.g., the other of the X-axis direction and the Y-axis direction in FIG. 1). Here, centers of the first sub-pixels F1 in the first direction among the plurality of first sub-pixels F1 may be arranged on one straight line, and the straight line may be arranged in the same direction as the first direction. Also, centers of the first sub-pixels F1 arranged in the second direction among the plurality of first sub-pixels F1 may be arranged on one straight line, and the straight line may be arranged in the same direction as the first direction.

A first side S1 and a second side S2 of each of the first sub-pixels F1 may form a certain angle with each other. In particular, the first side S1 and the second side S2 of the first sub-pixel F1 may form a right angle with each other. Here, the first side S1 and the second side S2 may be arranged in a state of being tilted in different directions with respect to at least one of the first direction and the second direction, respectively. Accordingly, each of the first sub-pixels F1 may be arranged in a rhombic form with respect to one of the first direction and the second direction, and the two sides S1 and S2 adjacent to the respective vertexes of the first sub-pixels F1 may be about 90 degrees.

In this case, the second sub-pixel F2 and the third sub-pixel F3 may be arranged on the first side S1 or the second side S2 of the first sub-pixels F1 to face the first sub-pixel F1. In this case, the second sub-pixel F2 and the third sub-pixel F3 may be arranged to be tilted with respect to one of the first direction and the second direction. In particular, the second sub-pixel F2 and the third sub-pixel F3 may be tilted so as to form an angle of about 45 degrees with respect to one of the first direction and the second direction. For example, at least one of a short side and a long side of at least one of the second sub-pixel F2 and the third sub-pixel F3 may form an angle of about 45 degrees with respect to a straight line connecting centers of a plurality of first sub-pixels F1 in the first direction.

The second sub-pixel F2 and the third sub-pixel F3 may have a rectangular shape. Here, an area of at least one of the second sub-pixel F2 and the third sub-pixel F3 may be less than an area of the first sub-pixel F1. Furthermore, at least one of the second sub-pixel F2 and the third sub-pixel F3 facing the first sub-pixel F1 may be arranged so as to overlap with one side (e.g., the first side S1 or the second side S2) of the first sub-pixel F1 facing the second sub-pixel F2 and the third sub-pixel F3 or an extension line of the one side of the first sub-pixel F1. That is, at least a portion of the second sub-pixel F2 and at least a portion of the third sub-pixel F3 adjacent to each other may be arranged within a length range of one of the first side S1 and the second side S2. The short side or the long side of at least one of the second sub-pixel F2 and the third sub-pixel F3 facing the first sub-pixel F1 may be parallel to the first side S1 or the second side S2.

For example, in an embodiment, extension lines of short sides of a plurality of second sub-pixels F2 respectively facing the first side S1 and the second side S2 may intersect with each other, or extension lines of long sides of the second sub-pixels F2 respectively facing the first side S1 and the second side S2 may intersect with each other. As another embodiment, extension lines of short sides of a plurality of third sub-pixels F3 respectively facing the first side S1 and the second side S2 may intersect with each other, or extension lines of long sides of the third sub-pixels F3 respectively facing the first side S1 and the second side S2 may intersect with each other. As another embodiment, the extension line of the short side of the second sub-pixel F2 facing the first side S1 and the extension line of the short side of the third sub-pixel F3 facing the second side S2 may intersect with each other, or the extension line of the long side of the second sub-pixel F2 facing the first side S1 and the extension line of the long side of the third sub-pixel F3 facing the second side S2 may intersect with each other. As another embodiment, the extension line of the long side of the second sub-pixel F2 facing the first side S1 and the extension line of the short side of the third sub-pixel F3 facing the second side S2 may intersect with each other, or the extension line of the short side of the second sub-pixel F2 facing the first side S1 and the extension line of the long side of the third sub-pixel F3 facing the second side S2 may intersect with each other.

The plurality of second sub-pixels F2 may be spaced apart from each other in at least one of the first direction and the second direction. In an embodiment, the center of some of the plurality of second sub-pixels F2 in the first direction or the second direction may be disposed on a straight line. As another embodiment, the center of some of the plurality of second sub-pixels F2 in the first direction or the second direction may be disposed on a straight line, and the center of another portion of the plurality of second sub-pixels F2 arranged in the other of the first direction and the second direction may be disposed in a serpentine (e.g., zigzag) shape along the other of the first direction and the second direction. Hereinafter, for convenience of explanation, a case where the center of some of the plurality of second sub-pixels F2 in the first direction may be disposed on a straight line, and the center of another portion of the plurality of second sub-pixels F2 arranged in the second direction may be disposed in a serpentine shape will be mainly described in detail.

The plurality of third sub-pixel F3 may also be arranged to be spaced apart from each other in at least one of the first direction and the second direction similarly to the second sub-pixel F2. Here, the plurality of third sub-pixels F3 may also be arranged similarly to the second sub-pixel F2. Hereinafter, for convenience of explanation, a case where centers of a portion of the plurality of third sub-pixels F3 in the first direction among the plurality of third sub-pixels F3 are on a straight line, and the center of another portion of the plurality of third sub-pixels F3 arranged in the second direction among the plurality of third sub-pixels F3 are on a serpentine line will be mainly described in detail.

In this case, one of the second sub-pixel F2 and the third sub-pixel F3 facing the first side S1 of the first sub-pixel F1 may be disposed to be symmetrical about a straight line (otherwise, a straight line parallel to the first direction passing through the center of two adjacent sub-pixels) connecting one of the second sub-pixel F2 and the third sub-pixel F3 facing the second side S2 of the first sub-pixel F1 to the centers of the first sub-pixels F1 in the first direction. For example, the second sub-pixel F2 facing the first side S1 may be symmetrical with the third sub-pixel F3 facing the second side S2 with respect to the straight line. Also, the third sub-pixel F3 facing the first side S1 may be symmetrical with the second sub-pixel F2 facing the second side S2 with respect to the straight line. Here, a distance between the centers of adjacent second sub-pixels F2 may be the same as a distance between the centers of adjacent third sub-pixels F3. As another embodiment, the second sub-pixel F2 and the third sub-pixel F3 facing the first side S1 may be symmetric with respect to the second sub-pixel F2 and the third sub-pixel F3 facing the second side S2, respectively. Here, a distance between centers of one of a pair of second sub-pixels F2 and a pair of third sub-pixels F3 arranged symmetrically with respect to each other may be less than a distance between centers of the other of a pair of second sub-pixels F2 and a pair of third sub-pixels F3 arranged symmetrically with respect to each other. In this case, a pair of second sub-pixels F2 adjacent to each other may be disposed between a pair of third sub-pixels F3 adjacent to each other or the pair of third sub-pixels F3 adjacent to each other may be disposed between the pair of second sub-pixels F2 adjacent to each other. However, hereinafter, for convenience of explanation, a case where the second sub-pixel F2 is disposed to be symmetrical about a straight line connecting the third sub-pixel F3 to a center of the first sub-pixel F1 in the first direction will be mainly described in detail.

When the second sub-pixel F2 is disposed as described above, a first distance L1 that is a shortest distance from an edge of the first sub-pixel F1 to the second sub-pixel F2 and a second distance L2 that is the shortest distance from the edge of the first sub-pixel F1 to the third sub-pixel F3 may be approximately equal to each other. In this case, the shortest distance may be measured from the first side S1 or the second side S2 to one side of the second sub-pixel F2 or one side of the third sub-pixel F3 in a direction perpendicular to one of the first side S1 and the second side S2. In some examples, in another embodiment, the shortest distance may be measured to one side of the second sub-pixel F2 or one side of the third sub-pixel F3 in a direction perpendicular to an extension line of one of the first side S1 and the second side S2. However, hereinafter, for convenience of explanation, a case where the shortest distance is measured from an extension line of the first side S1 or the first side S1 with respect to the second sub-pixel F2 and the third sub-pixel F3 facing the first side S1 will be mainly described in detail. Here, as another embodiment other than the above case, the shortest distance may be measured by a distance from a center of the first sub-pixel F1 to a center of the second sub-pixel F2 or a distance from the center of the first sub-pixel F1 to a center of the third sub-pixel F3. As the other embodiment, the shortest distance may be measured by a distance from the first side S1 of the first sub-pixel F1 or the extension line of the first side S1 to a center of the second sub-pixel F2 or to a center of the third sub-pixel F3.

The first distance L1 and the second distance L2 measured at the extension line of the first side S1 or the first side S1 may be approximately equal to each other. Here, the first distance L1 may be a distance from one of the first side S1 and the extension line of the first side S1 to the short side of the second sub-pixel F2, and the second distance L2 may be a distance from one of the first side S1 and the extension line of the side S1 and to the short side of the third sub-pixel F3.

An outline R connecting a portion of an edge of the second sub-pixel F2 facing one side of the first sub-pixel F1 to a portion of the third sub-pixel F3 may be square. For example, the outline R may be drawn by connecting the remaining edge of the second sub-pixel F2 and the remaining edge of the third sub-pixel F3 excluding the one side of the second sub-pixel F2 and the one side of the third sub-pixel F3 in which the second sub-pixel F2 and the third sub-pixel F3 face each other and by connecting a vertex of the second sub-pixel F2 to a vertex of the third sub-pixel F3 at a portion where the second sub-pixel F2 and the third sub-pixel F3 are apart from each other. The outline R forms a square so that the second sub-pixel F2 and the third sub-pixel F3 may be mirror-arranged at the second side S2 so as to correspond to the arrangement of the second sub-pixel F2 and the third sub-pixel F3 facing the first side S1.

The first intermediate layer 28-2A, the second intermediate layer 28-2B, and the third intermediate layer 28-2C respectively forming the first sub-pixel F1, the second sub-pixel F2, and the third sub-pixel F3 may be formed and arranged to be the same as or similar to the first sub-pixel F1, the second sub-pixel F2, and the third sub-pixel F3, respectively. The centers of the first intermediate layer 28-2A, the second intermediate layer 28-2B, and the third intermediate layer 28-2C may be disposed at the same or different position from the first sub-pixel F1, the second sub-pixel F2, and the third sub-pixel F3, respectively. Contents of the first sub-pixel F1, the second sub-pixel F2, and the third sub-pixel F3 described above may be applied to the first intermediate layer 28-2A, the second intermediate layer 28-2B, and the third intermediate layer 28-2C, respectively.

An apparatus for manufacturing a display device to be described later below may form various suitable layers on the display substrate D. For example, the apparatus for manufacturing the display device may form at least one of the intermediate layers 28-2 on the display substrate D. In more detail, the apparatus for manufacturing the display device may form at least one of an organic emission layer, a hole injection layer, a hole transporting layer, an electron injection layer, an electron transporting layer, and a functional layer in the intermediate layer 28-2. In particular, when the apparatus for manufacturing the display device forms at least one layer of the intermediate layer 28-2 on the display substrate D, the apparatus for manufacturing the display device may manufacture one layer through a plurality of deposition materials or may concurrently (e.g., simultaneously) manufacture a plurality of layers. The encapsulation layer E may include a plurality of inorganic layers or may include an inorganic layer and an organic layer.

The organic layer of the thin-film encapsulation layer E is formed of a polymer and may include polyethylene terephthalate, polyethylene naphthalate, polycarbonate, polyimide, polyethylene sulfonate, polyoxymethylene, polyarylate, hexamethyldisiloxane (e.g., polymethyl methacrylate, a polyacrylic acid, etc.), and/or the like.

The inorganic layer of the thin-film encapsulation layer E may be a single layer or stacked layers including a metal oxide or a metal nitride. In detail, the inorganic layer may include SiNx, $Al_2O_3$, $SiO_2$, $TiO_2$, and/or the like.

An uppermost layer of the thin-film encapsulation layer E that is exposed to the outside may be an inorganic layer in order to prevent or substantially prevent moisture from penetrating into an OLED.

The thin-film encapsulation layer E may include at least one sandwich structure in which at least one organic layer is inserted between at least two inorganic layers. As another example, the thin-film encapsulation layer E may include at least one sandwich structure in which at least one inorganic layer is inserted between at least two organic layers. As another example, the thin-film encapsulation layer E may include a sandwich structure in which at least one organic layer is inserted between at least two inorganic layers and a sandwich structure in which at least one inorganic layer is inserted between at least two organic layers.

The thin-film encapsulation layer E may sequentially include a first inorganic layer, a first organic layer, and a second inorganic layer from an upper portion of the OLED.

As another example, the thin-film encapsulation layer E may sequentially include a first inorganic layer, a first organic layer, a second inorganic layer, a second organic layer, and a third inorganic layer from an upper portion of the OLED.

As another example, the thin-film encapsulation layer E may sequentially include a first inorganic layer, a first organic layer, a second inorganic layer, a second organic layer, a third inorganic layer, a third organic layer, and a fourth inorganic layer from an upper portion of the OLED.

An area of the first organic layer may be less than an area of the second inorganic layer. The area of the second inorganic layer may also be less than an area of the third inorganic layer.

When a plurality of inorganic layers are provided as described above, the inorganic layers may be deposited so as to be in direct contact with each other in an edge region of the display device, and organic layers may not be exposed to the outside.

A capping layer may be disposed between the OLED and the first inorganic layer. The capping layer has a refractive index lower than that of the opposite electrode 28-3, and improves light efficiency by reducing the ratio at which light generated in the intermediate layer 28-2 is totally reflected and is not emitted to the outside.

For example, the capping layer may include an organic material such as poly (3, 4-ethylenedioxythiophene) (PEDOT), 4, 4'-bis [N-(3-methylphenyl)-N-phenylamino] biphenyl (TPD), 4, 4', 4"-tris [(3-methylphenyl) phenyl amino] triphenylamine (m-MTDATA), 1, 3, 5-tris [N, N-bis (2-methylphenyl)-amino]-benzene (o-MTDAB), 1, 3, 5-tris [N, N-bis (3-methylphenyl)-amino]-benzene (m-MTDAT), 1, 3, 5-tris [N, N-bis (4-methylphenyl)-amino]-benzene (p-MTDAB), 4, 4'-bis [N, N-bis (3-methylphenyl)-amino]-diphenylmethane (BPPM), 4, 4'-dicarbazolyl-1, 1'-biphenyl (CBP), 4, 4', 4"-tris (N-carbazole) triphenylamine (TCTA), 2, 2', 2"'-(1,3,5-benzenetolyl) tris-[1-phenyl-1H-benzoimidazole] (TPBI), and 3-(4-biphenyl)-4-phenyl-5-t-butylphenyl-1,2,4-triazole (TAZ).

In some examples, the capping layer may include an inorganic material such as zinc oxide, titanium oxide, zirconium oxide, silicon nitride, niobium oxide, tantalum oxide, tin oxide, nickel oxide, indium nitride, and gallium nitride. However, the material capable of forming the capping layer is not limited thereto and may be formed of various suitable materials.

A cover layer may be on the capping layer. The cover layer protects the OLED from damage that may occur in a subsequent process using plasma or the like. The cover layer may include lithium fluoride (LiF).

The display device 20 as described above may be fixed to a device such as a vehicle for moving a user. The display device 20 may be fixed to the device so as to form an angle different from 0 degrees between a user's viewing direction and the first direction or the second direction. For example, the display device 20 may be arranged so that the user's viewing direction of the display device 20 and the first direction or the second direction form an angle of about 90 degrees. Hereinafter, for convenience of explanation, a case where the user's viewing direction of the display device 20 and the first direction form an angle of about 90 degrees will be mainly described in detail.

In the above case, when a user looks at the display device 20, an inclined portion of the pixel-defining layer 29 is not perpendicular to the user's viewing direction. Accordingly, external light may be prevented or substantially prevented from being reflected through the inclined portion of the pixel-defining layer 29 and incident on the user's eyes.

Further, the display device 20 may implement a precise image through each sub-pixel.

Figure 4:
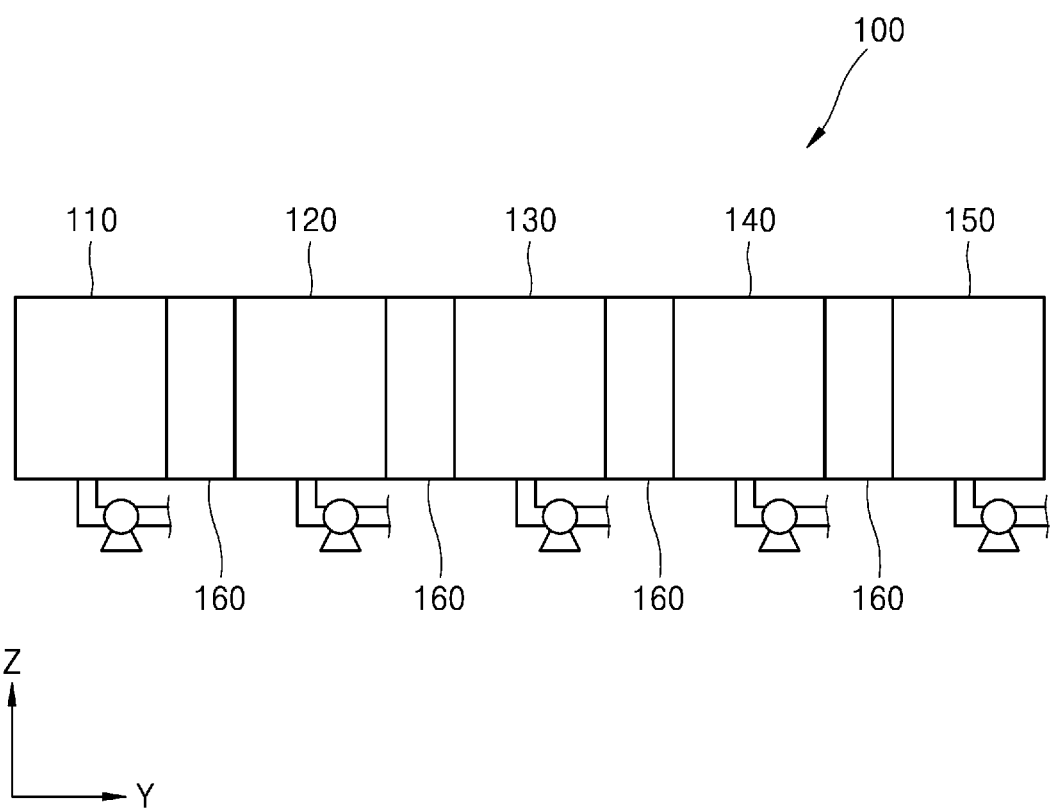
FIG. 4 is a side view of an apparatus for manufacturing the display device shown in FIG. 1.
Figure 5:
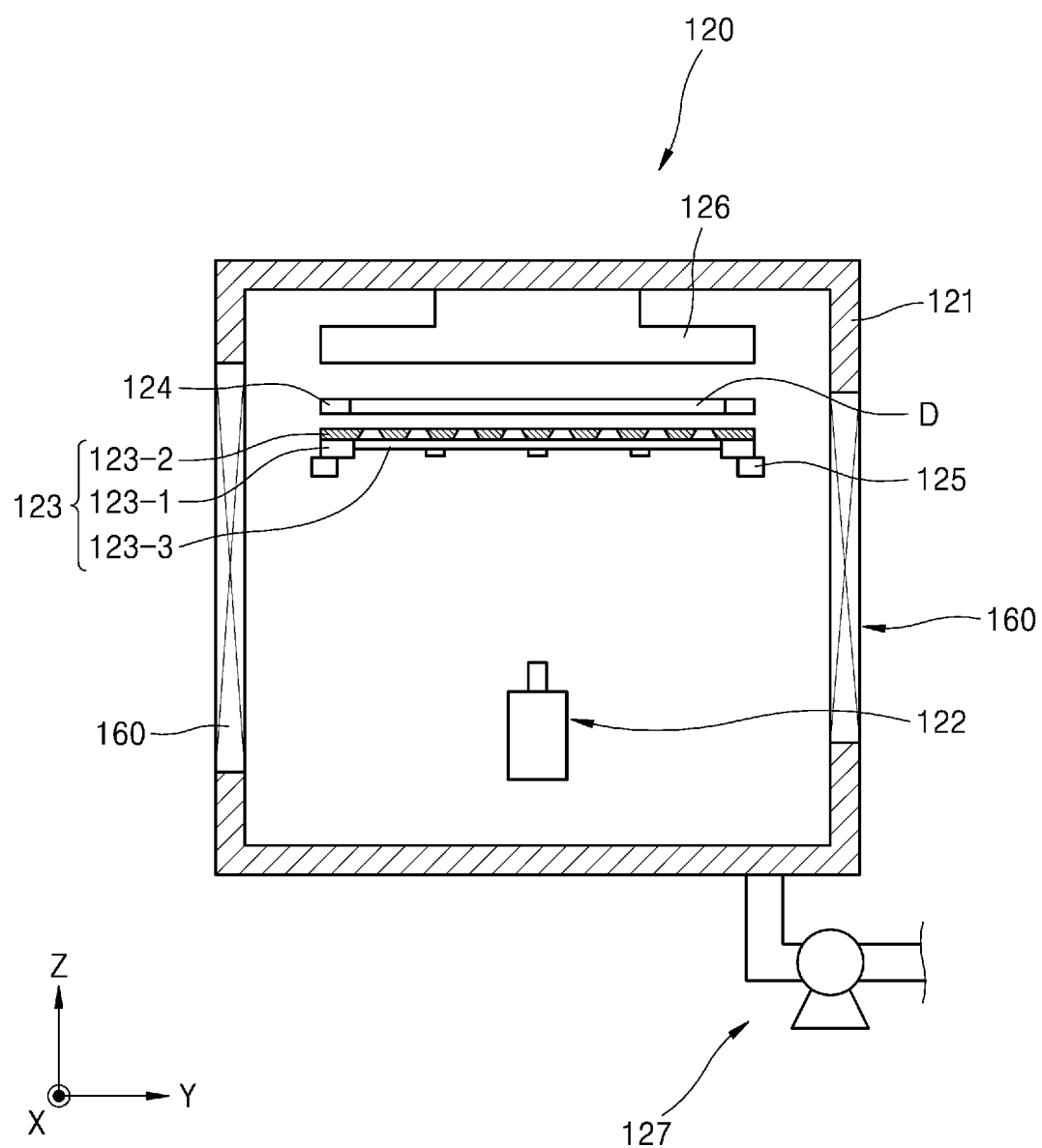
FIG. 5 is a cross-sectional view of a first deposition unit shown in FIG. 4.
Figure 6:
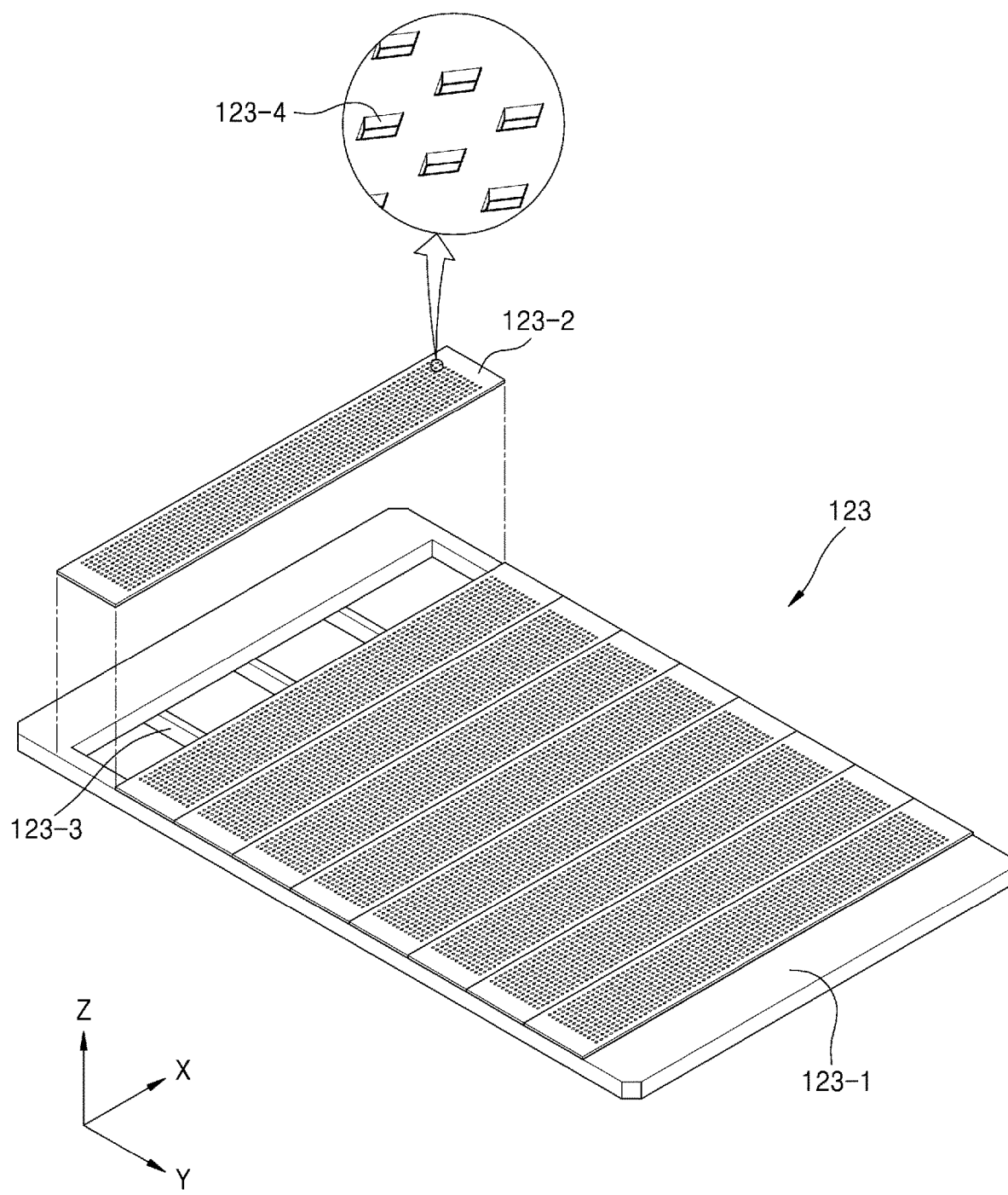
FIG. 6 is a perspective view of a first mask assembly shown in FIG. 5.
Figure 7:
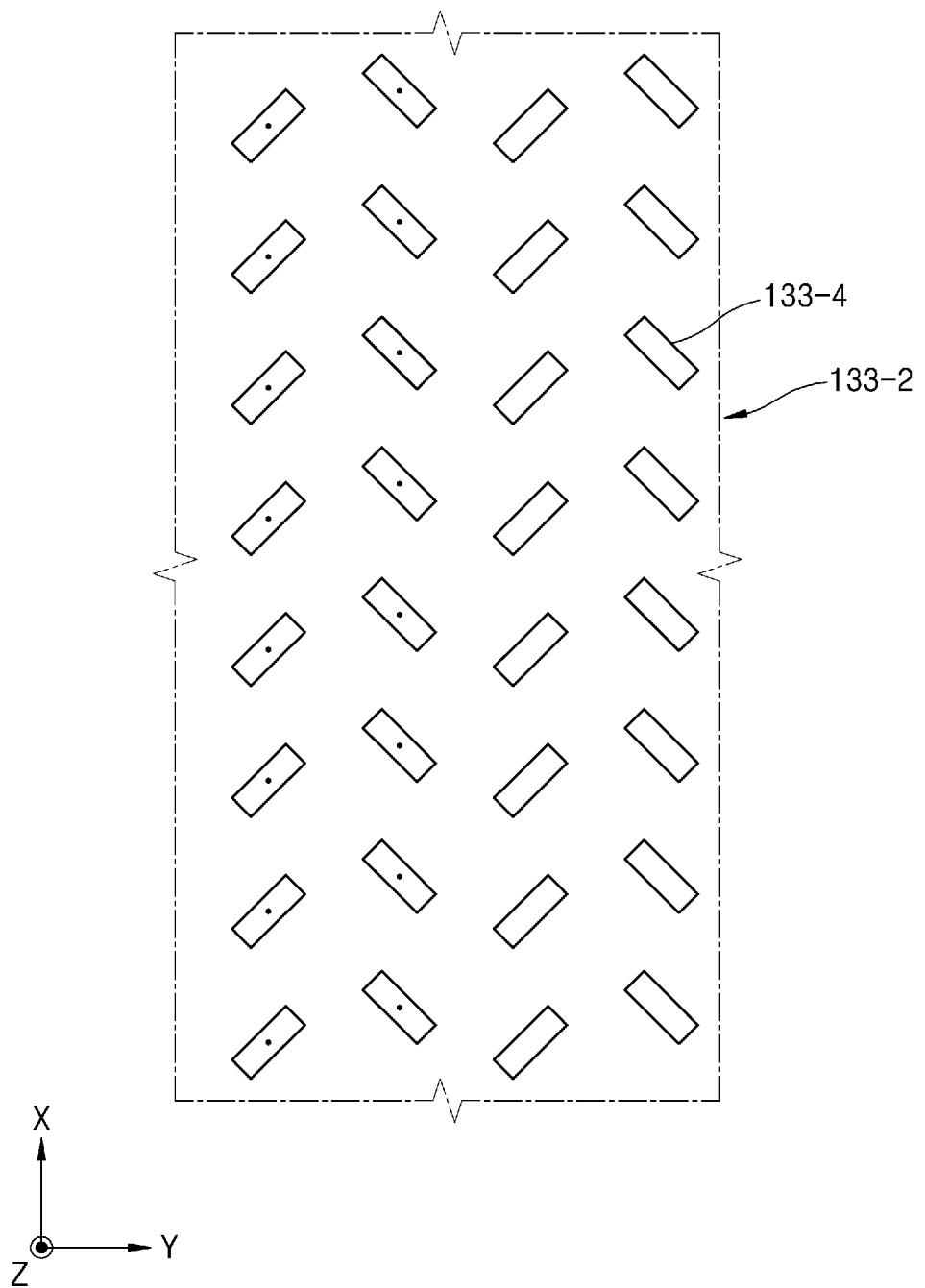
FIG. 7 is a plan view of a portion of a second mask sheet used in a second deposition unit shown in FIG. 4.
Figure 8:
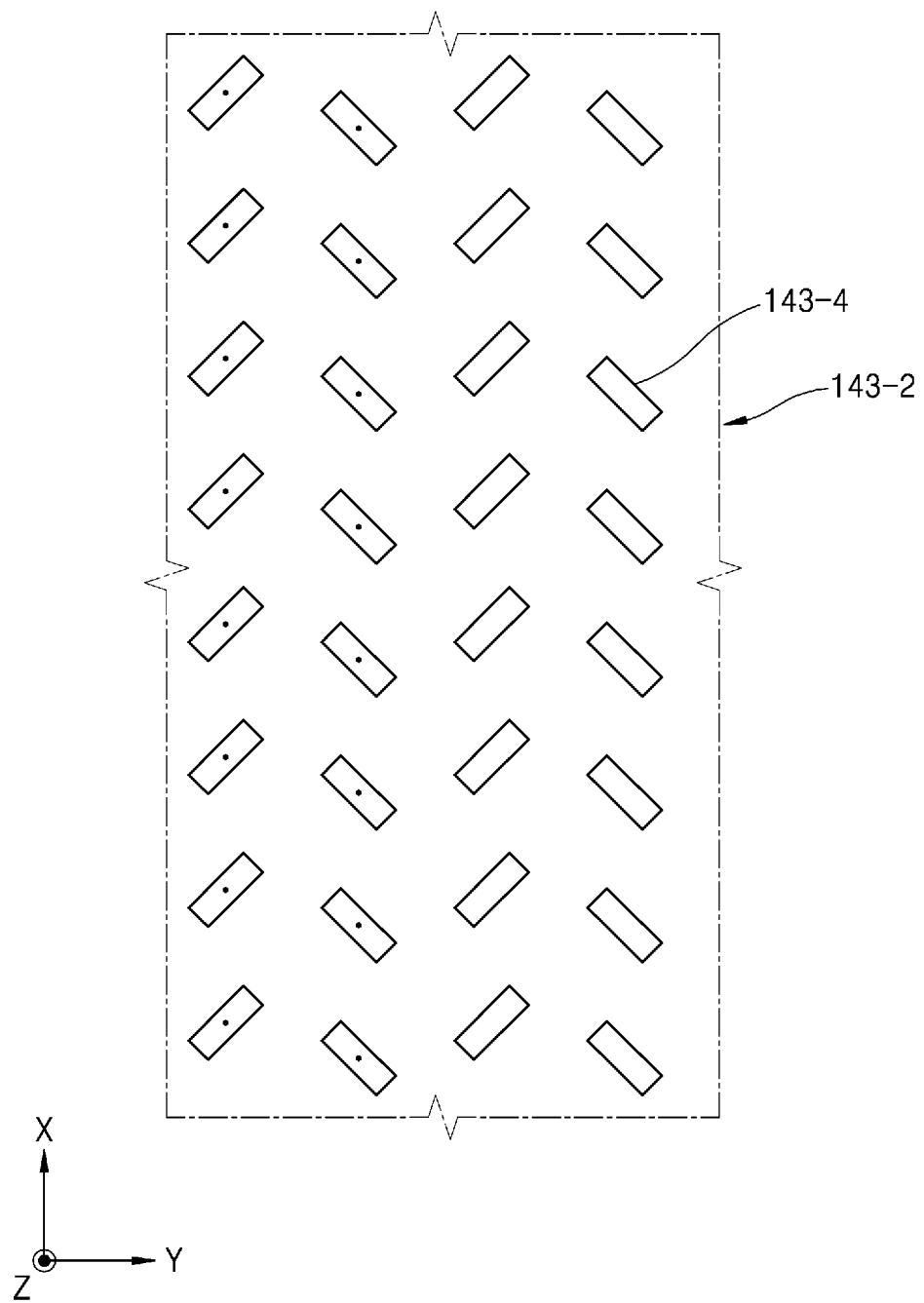
FIG. 8 is a plan view of a portion of a third mask sheet used in a third deposition unit shown in FIG. 4.

FIG. 4 is a side view of an apparatus for manufacturing the display device shown in FIG. 1. FIG. 5 is a cross-sectional view of a first deposition unit shown in FIG. 4. FIG. 6 is a perspective view of a first mask assembly shown in FIG. 5. FIG. 7 is a plan view of a portion of a second mask sheet used in a second deposition unit shown in FIG. 4. FIG. 8 is a plan view of a portion of a third mask sheet used in a third deposition unit shown in FIG. 4.

Referring to FIGS. 4 to 8, a display device manufacturing apparatus 100 may include a device for loading the display substrate D, a device for manufacturing the display substrate D, a device for forming an intermediate layer on the display substrate D, a device for forming a thin-film encapsulation layer on the display substrate D, a device for unloading the display substrate D, and the like. In this case, in an embodiment, the display device manufacturing apparatus 100 may be formed by connecting the above-described devices in an in-line form. As another embodiment, in the display device manufacturing apparatus 100, only a portion of the devices described above may be arranged in an in-line form, and the other portion may be arranged so as to be separated from the portion of the in-line form. As another embodiment, the display device manufacturing apparatus 100 may also be formed by arranging the devices separately. However, hereinafter, for convenience of explanation, a case where the display device manufacturing apparatus 100 includes the device for loading the display substrate D, the device for forming an intermediate layer, and the device for unloading the display substrate D will be mainly described in detail.

The display device manufacturing apparatus 100 may include a loading unit 110, a first deposition unit 120, a second deposition unit 130, a third deposition unit 140, and an unloading unit 150. In addition, the display device manufacturing apparatus 100 may include a shielding unit 160 disposed between the devices connected to each other to cut or connect the space of each device.

The first deposition unit 120, the second deposition unit 130, and the third deposition unit 140 may deposit a first intermediate layer, a second intermediate layer, and a third intermediate layer on the display substrate D in various suitable orders, respectively. For example, the first deposition unit 120 may deposit one of the first intermediate layer, the second intermediate layer, and the third intermediate layer on the display substrate D, the second deposition unit 130 may deposit another one of the first intermediate layer, the second intermediate layer, and the third intermediate layer on the display substrate D, and the third deposition unit 140 may deposit the other of the first intermediate layer, the second intermediate layer, and the third intermediate layer on the display substrate D. However, hereinafter, for convenience of explanation, a case where the first deposition unit 120 deposits the first intermediate layer on the display substrate D, the second deposition unit 130 deposits the second intermediate layer on the display substrate D, and the third deposition unit 140 deposits the third intermediate layer on the display substrate D will be mainly described in detail. Furthermore, a case where the first intermediate layer, the second intermediate layer, and the third intermediate layer have the same shape and arrangement as the first sub-pixel, the second sub-pixel, and the third sub-pixel described with reference to FIGS. 1 to 3 above will be mainly described in detail.

In the loading unit 110, the display substrate D may be inserted from the outside and temporarily stored. Here, the loading unit 110 may store a plurality of display substrates D or one display substrate D. The loading unit 110 may receive the display substrate D from the outside through a robot arm or a movable shuttle disposed therein and may supply the display substrate D to the first deposition unit 120. Hereinafter, for convenience of explanation, a case where the loading unit 110 supports the display substrate D through the robot arm therein, and the display substrate D supplied from the robot arm is mounted on a shuttle and supplied to the first deposition unit 120 from the loading unit 110 will be mainly described in detail.

The first deposition unit 120 may deposit the first intermediate layer on the display substrate D. In this case, there may be one or more of the first deposition unit 120. For example, when one first deposition unit 120 is provided in an embodiment, the first deposition unit 120 may form at least one layer of the first intermediate layer. The first deposition unit 120 may include at least one first deposition source 122 to form one layer of the first intermediate layer on the display substrate D. In particular, when a plurality of first deposition sources 122 are provided so that the first deposition unit 120 forms a plurality of layers of the intermediate layer, each of the first deposition sources 122 may be replaceable. Here, the first deposition sources 122 may store different deposition materials. As another embodiment, when a plurality of first deposition units 120 are provided, the first deposition units 120 may deposit the plurality of layers of the first intermediate layer on the display substrate D. Here, the first deposition units 120 may deposit different deposition materials on the display substrate D. However, hereinafter, for convenience of explanation, a case where only one first deposition source 122 is provided, and the first deposition source 122 forms only an organic emission layer of the first intermediate layer will be mainly described in detail.

The first deposition unit 120 may include a first chamber 121, the first deposition source 122, a first mask assembly 123, a first substrate supporting portion 124, a first mask supporting portion 125, a first magnetic force generating portion 126, and a first pressure regulating portion 127.

A space may be formed in the first chamber 121, and one side of the first chamber 121 may be opened to allow the display substrate D to be drawn out or contained. The shielding unit 160 including a gate valve or the like is disposed in the opened portion of the first chamber 121 and may be selectively opened and closed.

The first deposition source 122 may contain a first deposition material forming at least one layer of the first intermediate layer. The first deposition source 122 may vaporize or sublimate the first deposition material by applying energy (e.g., thermal energy, light energy, vibration energy, etc.).

The first deposition source 122 as described above may be replaceable. The first deposition source 122 may be replaced with a new first deposition source 122 when the contained first deposition material is exhausted.

The first mask assembly 123 may include a first mask frame 123-1, a first mask sheet 123-2, and a first support frame 123-3.

The first mask frame 123-1 may have an opening at the center thereof. In this case, the first mask frame 123-1 may be formed in a window frame shape. As another embodiment, the first mask frame 123-1 may have an opening at the center thereof, and a separate frame dividing the opening into a lattice form may be disposed. Hereinafter, for convenience of explanation, a case where the first mask frame 123-1 has an opening at the center thereof will be mainly described in detail.

The first mask sheet 123-2 is disposed on one side of the first mask frame 123-1 in a state of being extended in at least one direction of the first direction and the second direction and may be fixed to the first mask frame 123-1 through welding or the like. The first mask frame 123-1 may be formed with a groove to accommodate the first mask sheet 123-2. The first mask sheet 123-2 may be formed in a rectangular shape and may be disposed as one side of the first mask frame 123-1. Further, the first mask sheet 123-2 may be formed in a slit shape.

The first mask sheet 123-2 may be plural. The plurality of first mask sheets 123-2 may be arranged in a line so as to be adjacent to each other in the first direction or the second direction. In particular, in this case, a long side of the first mask sheet 123-2 may be disposed to be parallel to a long side or a short side of the first mask frame 123-1. Hereinafter, for convenience of explanation, a case where the long side of the first mask sheet 123-2 is disposed in the X-axis direction of FIG. 6 will be mainly described in detail.

The first mask sheet 123-2 may have a plurality of first openings 123-4. The plurality of first openings 123-4 may be arranged to be spaced apart from each other in the first direction and the second direction. In particular, each of the first openings 123-4 may be rhombic with a vertex arranged in an extension direction of the first mask sheet 123-2. In particular, each of the first openings 123-4 may be in the form of a square having an angle of about 90 degrees formed by two sides adjacent to each vertex. In this case, centers of some of the plurality of first openings 123-4 may be on a line in the extension direction of the first mask sheet 123-2 and a direction perpendicular to the extension direction of the first mask sheet 123-2. The plurality of first openings 123-4 may correspond to the arrangement of the first sub-pixels described with reference to FIGS. 1 to 3. In the case where the first opening 123-4 is formed as described above, even if the first mask sheet 123-2 is extended, an extension shape of the first mask sheet 123-2 may be predicted to some extent.

The first support frame 123-3 may be disposed in the first mask frame 123-1 to support the first mask sheet 123-2 as well as the first mask frame 123-1. The first support frame 123-3 may be disposed in the first mask frame 123-1 in a lattice shape to define a display area of one display device. That is, the first support frame 123-3 may define a plurality of display areas by dividing a central opening of the first mask frame 123-1 into a plurality of areas.

The first substrate supporting portion 124 may support the display substrate D. The first substrate supporting portion 124 may support the display substrate D by placing the display substrate D thereon or by adsorbing or attaching one surface of the display substrate D. For example, the first substrate supporting portion 124 may include a frame, a bar, or the like that is fixed within the first chamber 121. As another embodiment, the first substrate supporting portion 124 may include a clamp for holding the display substrate D. As another embodiment, the first substrate supporting portion 124 may include an adhesive chuck or an electrostatic chuck. In this case, the first substrate supporting portion 124 may be formed integrally with the first magnetic force generating portion 126. As another embodiment, the first substrate supporting portion 124 may also include a shuttle for transferring the display substrate D from the loading unit 110. However, hereinafter, for convenience of explanation, a case where the first substrate supporting portion 124 includes a shuttle will be mainly described in detail.

The first mask supporting portion 125 may support the first mask assembly 123. Since the first mask supporting portion 125 may be the same as or similar to the first substrate supporting portion 124 described above, detailed descriptions thereof will not be given herein for convenience of explanation. Hereinafter, a case where the first mask supporting portion 125 includes a frame fixed within the first chamber 121 and the first mask assembly 123 is placed and supported on the frame will be mainly described in detail.

The first magnetic force generating portion 126 may be disposed in the first chamber 121 to bring the first mask frame 123-1 into close contact with the display substrate D. Here, the first magnetic force generating portion 126 may include an electromagnet.

The first pressure regulating portion 127 may be connected to the first chamber 121 to adjust pressure inside the first chamber 121. The first pressure regulating portion 127 may include a pipe connected to the first chamber 121 and a pump disposed in the pipe.

The second deposition unit 130 may deposit a second deposition material on the display substrate D on which the first intermediate layer is formed to form the second intermediate layer. The second deposition unit 130 may be similar to the first deposition unit 120 described above. The second deposition unit 130 may include a second mask sheet 133-2. The second mask sheet 133-2 may be similar to the first mask sheet 123-2. In this case, the second mask sheet 133-2 may include a plurality of second openings 133-4. The plurality of second openings 133-4 may be spaced apart from each other. Some of the plurality of second openings 133-4 may be in a state of being tilted in one direction with respect to an extension direction (e.g., the X-axis direction in FIG. 7) of the second mask sheet 133-2. Some other of the plurality of second openings 133-4 may be in a state of being tilted in a direction different from the direction of the some of the plurality of second openings 133-4 with respect to an extension direction of the second mask sheet 133-2. In this case, a distance between two second openings 133-4 adjacent to each other along the extension direction of the second mask sheet 133-2 may be reduced or increased. For example, the plurality of second openings 133-4 may be tilted so as to have an angle different from 0 degrees with respect to the extension direction of the second mask sheet 133-2. In particular, the plurality of second openings 133-4 may be arranged so as to form an angle of about 45 degrees with respect to the extension direction of the second mask sheet 133-2.

In an embodiment, centers of the second openings 133-4 may form a straight line in one direction. For example, the centers of the second openings 133-4, which are arranged in the extension direction of the second mask sheet 133-2 and in a direction perpendicular to the extension direction of the second mask sheet 133-2, may be on a straight line. In this case, the plurality of second openings 133-4 may be arranged in a plurality of rows and columns. As another embodiment, centers of the some of the plurality of second openings 133-4 may form a straight line, and centers of some other of the plurality of second openings 133-4 may not form a straight line. For example, among the plurality of second openings 133-4 as described above, centers of the second openings 133-4 in a row arranged in the extension direction of the second mask sheet 133-2 may form a straight line. Among the plurality of second openings 133-4, centers of the second openings 133-4 arranged in a direction perpendicular to the extension direction of the second mask sheet 133-2 may form a serpentine shape (or a zigzag shape). However, hereinafter, for convenience of explanation, a case where, among the plurality of second openings 133-4, the centers of the some of the plurality of second openings 133-4 form a straight line, and the centers of some other of the plurality of second openings 133-4 do not form a straight line will be mainly described in detail. The plurality of second openings 133-4 may be rectangular.

The second mask sheet 133-2 may be fixed to a second mask frame in a state where extension force is applied as described above. In this case, when the plurality of second openings 133-4 are all tilted in the same direction with respect to an extension direction of the second mask sheet 133-2, deformation of the second mask sheet 133-2 may exceed a predictable range because degrees of deformation between the right and left or the front and back of the second mask sheet 133-2 are different from each other. In particular, in the above case, one portion of the second mask sheet 133-2 is largely deformed and the other portion of the second mask sheet 133-2 is not deformed or slightly deformed so that the shape of a second opening 133-4 may be distorted or the shape of the some of the plurality of second openings 133-4 and the shape of some other of the plurality of second openings 133-4 may be different from each other. Furthermore, in the above case, the centers of the some of the plurality of second openings 133-4 may not be on a line.

However, as described above, the some of the plurality of second openings 133-4 and some other of the plurality of second openings 133-4 are formed on the second mask sheet 133-2 by being tilted in different directions with respect to the extension direction of the second mask sheet 133-2. Therefore, the degree of deformation of the second mask sheet 133-2 during extension may be uniformly maintained throughout the entire second mask sheet 133-2. In particular, it is possible to induce uniform deformation throughout the second mask sheet 133-2 by tilting second openings 133-4 adjacent to each other in different directions with respect to the extension direction of the second mask sheet 133-2.

The third deposition unit 140 may deposit a third deposition material on the display substrate D on which the first intermediate layer and the second intermediate layer are formed to form the third intermediate layer. Here, the first intermediate layer, the second intermediate layer, and the third intermediate layer may be arranged so as not to overlap each other on a plane. The third deposition unit 140 may be similar to the first deposition unit 120. The third deposition unit 140 may include a third mask sheet 143-2 including a plurality of third openings 143-4. In this case, the third mask sheet 143-2 may be similar to the second mask sheet 133-2 and the third openings 143-4 may be arranged similarly to the second openings 133-4. However, when the second mask sheet 133-2 and the third mask sheet 143-2 are arranged so as to be stacked on each other, the second mask sheet 133-2 and the third mask sheet 143-2 may be manufactured such that the second openings 133-4 and the third openings 143-4 do not overlap each other.

The unloading unit 150 temporarily stores the display substrate D on which the first intermediate layer, the second intermediate layer, and the third intermediate layer are formed, and may unload the display substrate D to the outside or transfer the display substrate D to another device. The unloading unit 150 may include a robot arm or the like for transferring the display substrate D therein.

As described above, the display substrate D, on which the first intermediate layer, the second intermediate layer, and the third intermediate layer are formed, may be manufactured as the display device by forming the opposite electrode on the first intermediate layer, the second intermediate layer, and the third intermediate layer, and by forming the thin-film encapsulation layer.

Referring to the operation of the display device manufacturing apparatus 100, the display device manufacturing apparatus 100 may manufacture the first sub-pixel, the second sub-pixel, and the third sub-pixel in various suitable orders as described above. However, hereinafter, for convenience of explanation, a case where the display device manufacturing apparatus 100 sequentially manufactures the first sub-pixel, the second sub-pixel, and the third sub-pixel shown in FIGS. 1 to 3 will be mainly described in detail.

After the display substrate D is transferred to the loading unit 110, the loading unit 110 may transfer the display substrate D to the first deposition unit 120.

The first deposition unit 120 may supply the first deposition material to the first deposition source 122 to form the first intermediate layer on the display substrate D. The first deposition material may be deposited on the display substrate D through the first openings 123-4. In this case, the first intermediate layer may have a square shape that is tilted with respect to the extension direction of the first mask sheet 123-2.

After the above process is completed, the display substrate D is transferred from the first deposition unit 120 to the second deposition unit 130 and then the second deposition material may be deposited on the display substrate D in the second deposition unit 130. The second deposition unit 130 may form a pair of adjacent second intermediate layers which are tilted in different directions with respect to the extension direction of the second mask sheet 133-2 on the display substrate D.

Thereafter, the display substrate D may be transferred from the second deposition unit 130 to the third deposition unit 140. The third deposition unit 140 may supply the third deposition material to the display substrate D and the third deposition material that has passed through the third openings 143-4 may be deposited on the display substrate D. The third deposition unit 140 may form a pair of adjacent third intermediate layers which are tilted in different directions with respect to the extension direction of the third mask sheet 143-2 on the display substrate D.

The display substrate D on which the first intermediate layer, the second intermediate layer, and the third intermediate layer are formed may be taken out through the unloading unit 150 or supplied to a device for the next operation. Thereafter, the opposite electrode and the thin-film encapsulation layer may be formed on the display substrate D to complete the manufacture of the display device.

Therefore, according to the display device manufacturing apparatus 100 and a display device manufacturing method, it is possible to manufacture the display device having an accurate deposition pattern.

Furthermore, according to the display device manufacturing apparatus 100 and the display device manufacturing method, it is possible to minimize or substantially reduce an error between a design pattern and an actual deposition pattern that may occur during manufacturing.

Figure 9:
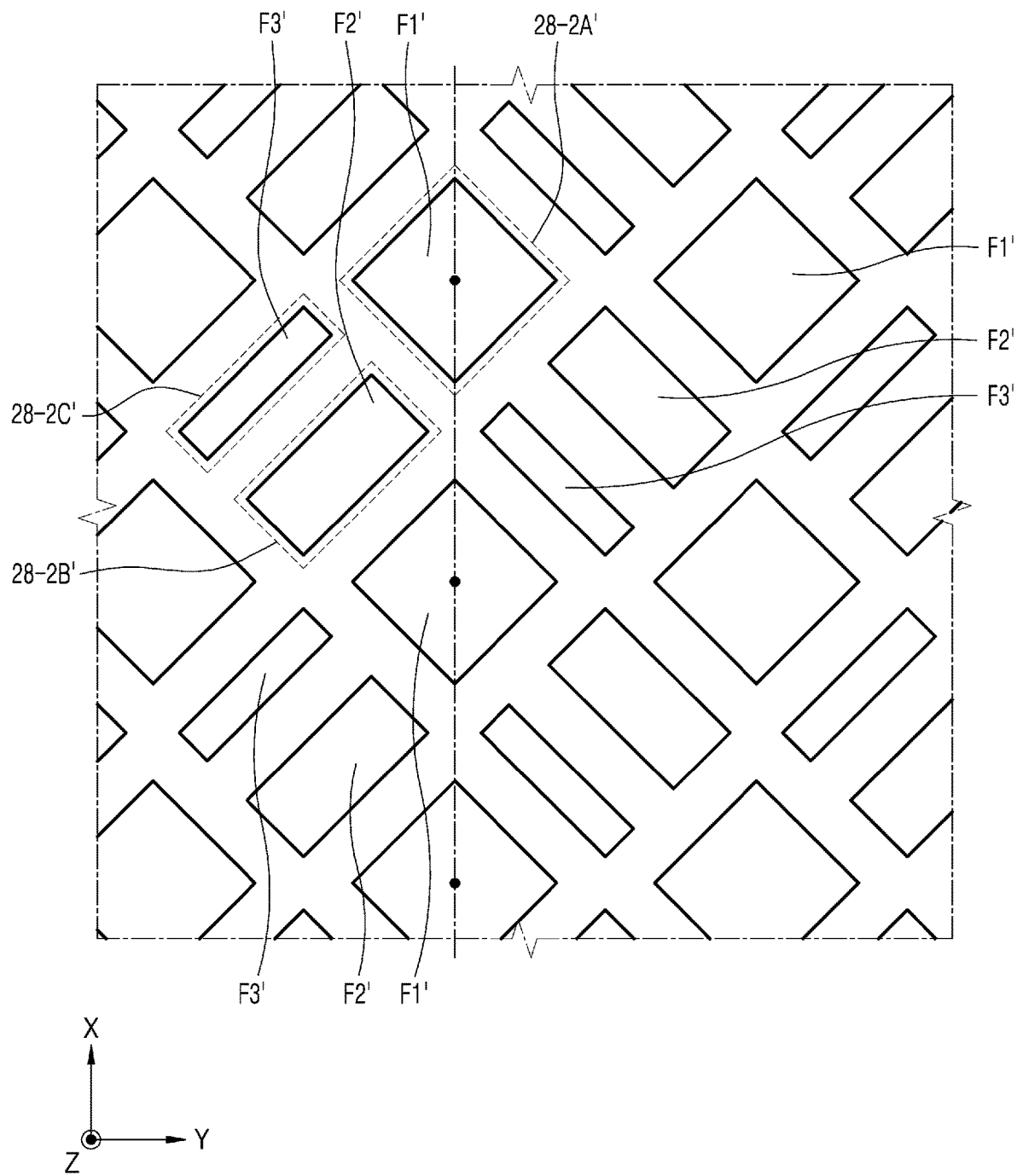
FIG. 9 is a plan view of a first sub-pixel, a second sub-pixel, and a third sub-pixel of a display device according to another embodiment.
Figure 10:
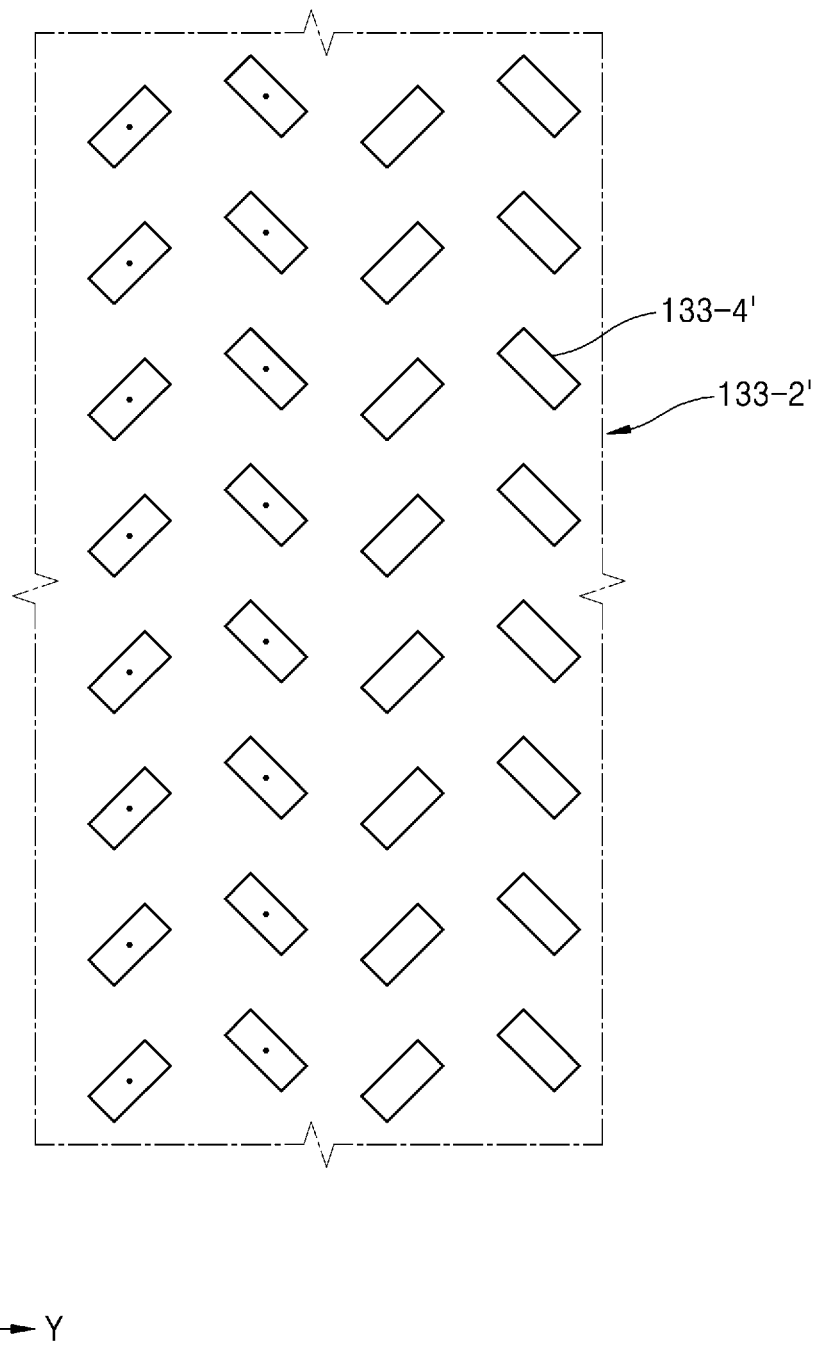
FIG. 10 is a plan view of a portion of a second mask sheet for depositing a second intermediate layer shown in FIG. 9.
Figure 11:
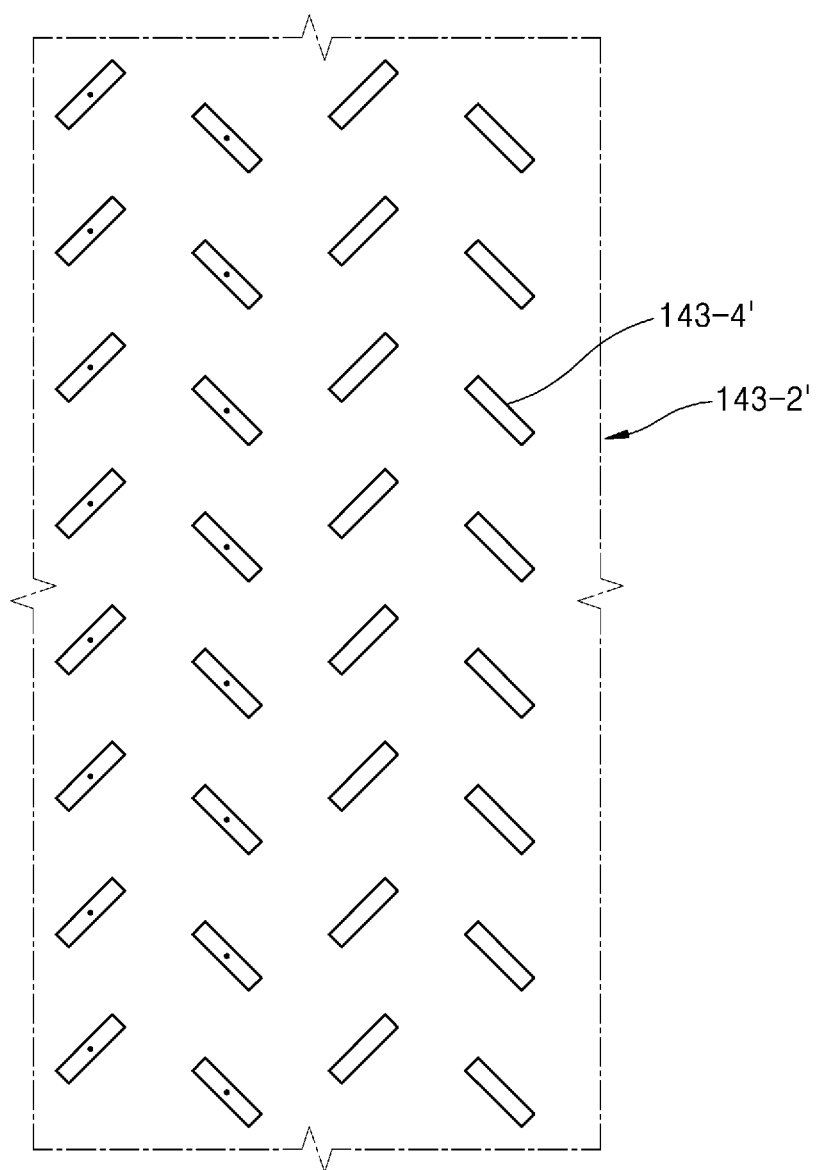
FIG. 11 is a plan view of a portion of a third mask sheet for depositing a third intermediate layer shown in FIG. 9.

FIG. 9 is a plan view of a first sub-pixel, a second sub-pixel, and a third sub-pixel of a display device according to another embodiment. FIG. 10 is a plan view of a portion of a second mask sheet for depositing a second intermediate layer shown in FIG. 9. FIG. 11 is a plan view of a portion of a third mask sheet for depositing a third intermediate layer shown in FIG. 9.

Referring to FIGS. 9 and 11, a display device may define a display area on a substrate and a non-display area in a contour of the display area. A plurality of sub-pixels including a first sub-pixel F1', a second sub-pixel F2', and a third sub-pixel F3' may be disposed in the display area, and a power wire may be disposed in the non-display area. In addition, a pad portion may be disposed in the non-display area. The display device may include a display substrate, an intermediate layer disposed in the display area, an opposite electrode, and a thin-film encapsulation layer.

The first sub-pixel F1', the second sub-pixel F2', and the third sub-pixel F3' may emit lights of different colors. For example, one of the first sub-pixel F1', the second sub-pixel F2', and the third sub-pixel F3' emits blue light, another one of the first sub-pixel F1', the second sub-pixel F2', and the third sub-pixel F3' emits red light, and the other of the first sub-pixel F1', the second sub-pixel F2', and the third sub-pixel F3' emits green light.

One of the first sub-pixel F1, the second sub-pixel F2, and the third sub-pixel F3 may be a square, and the other two may be rectangles.

Hereinafter, for convenience of explanation, a case where the first sub-pixel F1' is a square and emits red light, the second sub-pixel F2' is a rectangle and emits green light, and the third sub-pixel F3' is a rectangle and emits blue light will be mainly described in detail.

The first sub-pixel F1' as described above may include a first intermediate layer 28-2A', and the first intermediate layer 28-2A' may correspond to the shape and position of the first sub-pixel F1'. A planar area of the first intermediate layer 28-2A' may be equal to or greater than a planar area of the first sub-pixel F1', and the first sub-pixel F1' may be disposed inside the first intermediate layer 28-2A'.

The second sub-pixel F2' may include a second intermediate layer 28-2B'. In addition, the second intermediate layer 28-2B' may correspond to shape and position of the second sub-pixel F2'. The second sub-pixel F2' may be disposed inside the second intermediate layer 28-2B'.

The third sub-pixel F3' may include a third intermediate layer 28-2C'. In addition, the third intermediate layer 28-2C' may correspond to shape and position of the third sub-pixel F3'. The third sub-pixel F3' may be disposed inside the third intermediate layer 28-2C'.

A planar area of the second sub-pixel F2' and a planar area of the third sub-pixel F3' may be different from each other. For example, one of the planar area of the second sub-pixel F2' and the planar area of the third sub-pixel F3' may be less than the other of the planar area of the second sub-pixel F2' and the planar area of the third sub-pixel F3'. In an embodiment, the planar area of the second sub-pixel F2' may be less than the planar area of the third sub-pixel F3'. As another embodiment, the planar area of the third sub-pixel F3' may be less than the planar area of the second sub-pixel F2'. Therefore, it is possible to adjust an aperture ratio of light emitted from each sub-pixel.

As described above, adjustment of an area of at least one of the first sub-pixel F1', the second sub-pixel F2', and the third sub-pixel F3' may be performed by adjusting an area where a pixel-defining layer exposes a pixel electrode as described above. Here, areas and shapes of the first intermediate layer 28-2A', the second intermediate layer 28-2B', and the third intermediate layer 28-2C' formed by being respectively deposited on the first sub-pixel F1', the second sub-pixel F2', and the third sub-pixel F3' may correspond to respective sub-pixels so as to prevent the respective sub-pixels from overlapping with each other.

A second mask sheet 133-2' and a third mask sheet 143-2' may be used to form the second intermediate layer 28-2B' and the third intermediate layer 28-2C' as described above. The second mask sheet 133-2' may include a plurality of second openings 133-4', and the third mask sheet 143-2' may include third openings 143-4'. In this case, an area of each of the second openings 133-4 'and the area of each of the third openings 143-4' may be different from each other. In particular, the area of each of the second openings 133-4' and the area of each of the third openings 143-4' may correspond the area of the second intermediate layer 28-2B' and the area of the third intermediate layer 28-2C', respectively. The relationship between each sub-pixel, each intermediate layer, and each opening as described above may be applicable to all embodiments of the present disclosure.

Two second openings 133-4' adjacent to each other among the second openings 133-4' may be disposed in a state of being tilted in the opposite directions with respect to an extension direction of the second mask sheet 133-2'. Furthermore, two third openings 143-4' adjacent to each other among the third openings 143-4' may be disposed in a state of being tilted in the opposite directions with respect to an extension direction of the third mask sheet 143-2'.

As described above, even when the second mask sheet 133-2' and the third mask sheet 143-2' are extended, shapes of the second openings 133-4' and the third openings 143-4' are maintained substantially similar to the initial shapes and may be moved within a predictable range to some extent when positions of the second openings 133-4' and the third opening 143-4' are variable in the initial position. Therefore, it is somewhat possible to correct a pattern when depositing a second deposition material and a third deposition material on the display substrate in the future.

The display device may be fixed to a device or the like that can be operated by a user such as a vehicle. The display device may be fixed to the device so as to form a certain angle different from 0 degrees between a user's viewing direction and the first direction or the second direction. For example, the display device may be arranged such that the user's viewing direction of the display device and the first direction or the second direction form an angle of about 90 degrees.

In the above case, when a user looks at the display device, an inclined portion of a pixel-defining layer is not perpendicular to the user's viewing direction. Accordingly, external light may be prevented or substantially prevented from being reflected through the inclined portion of the pixel-defining layer and incident on the user's eyes.

Further, the display device may implement a precise image through each sub-pixel.

The display device may be manufactured through a manufacturing apparatus of the display device. The display device manufacturing apparatus may be formed similar to that shown in FIGS. 4 and 5. In this case, a second deposition unit and a third deposition unit form the first intermediate layer 28-2A' by using the first mask assembly 123 shown in FIG. 6. The second intermediate layer 28-2B' and the third intermediate layer 28-2C' may be formed on the display substrate by using the second mask sheet 133-2' and the third mask sheet 143-2'.

According to a display device manufacturing apparatus and a display device manufacturing method, a display device having a precise deposition pattern may be manufactured by minimizing or substantially reducing the deformation of each mask sheet.

Furthermore, according to the display device manufacturing apparatus and the method of manufacturing the display device, it is possible to minimize or substantially reduce an error between a design pattern and an actual deposition pattern that may occur during manufacturing.

Figure 12:
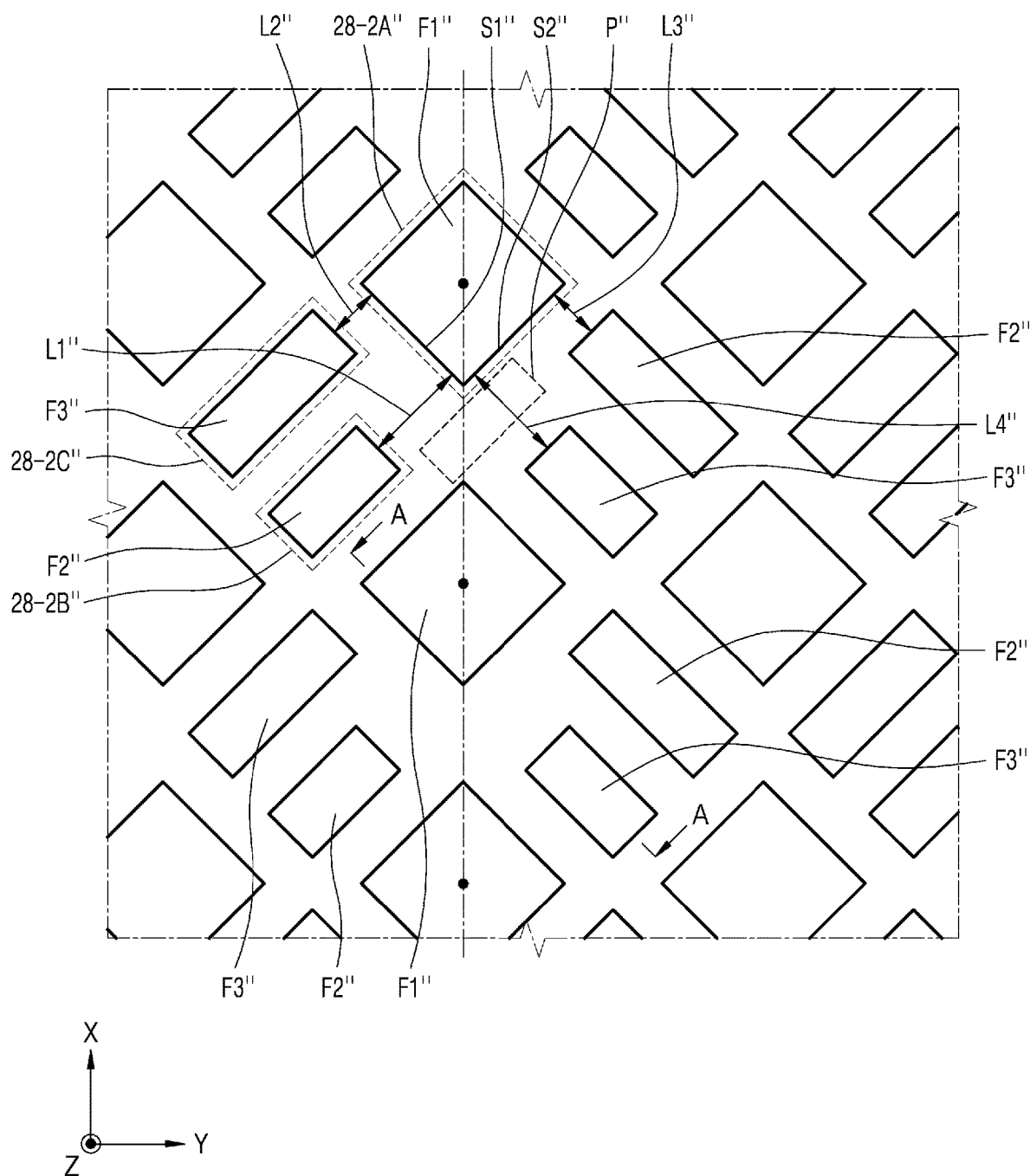
FIG. 12 is a plan view of a first sub-pixel, a second sub-pixel, and a third sub-pixel of a display device according to another embodiment.
Figure 13:
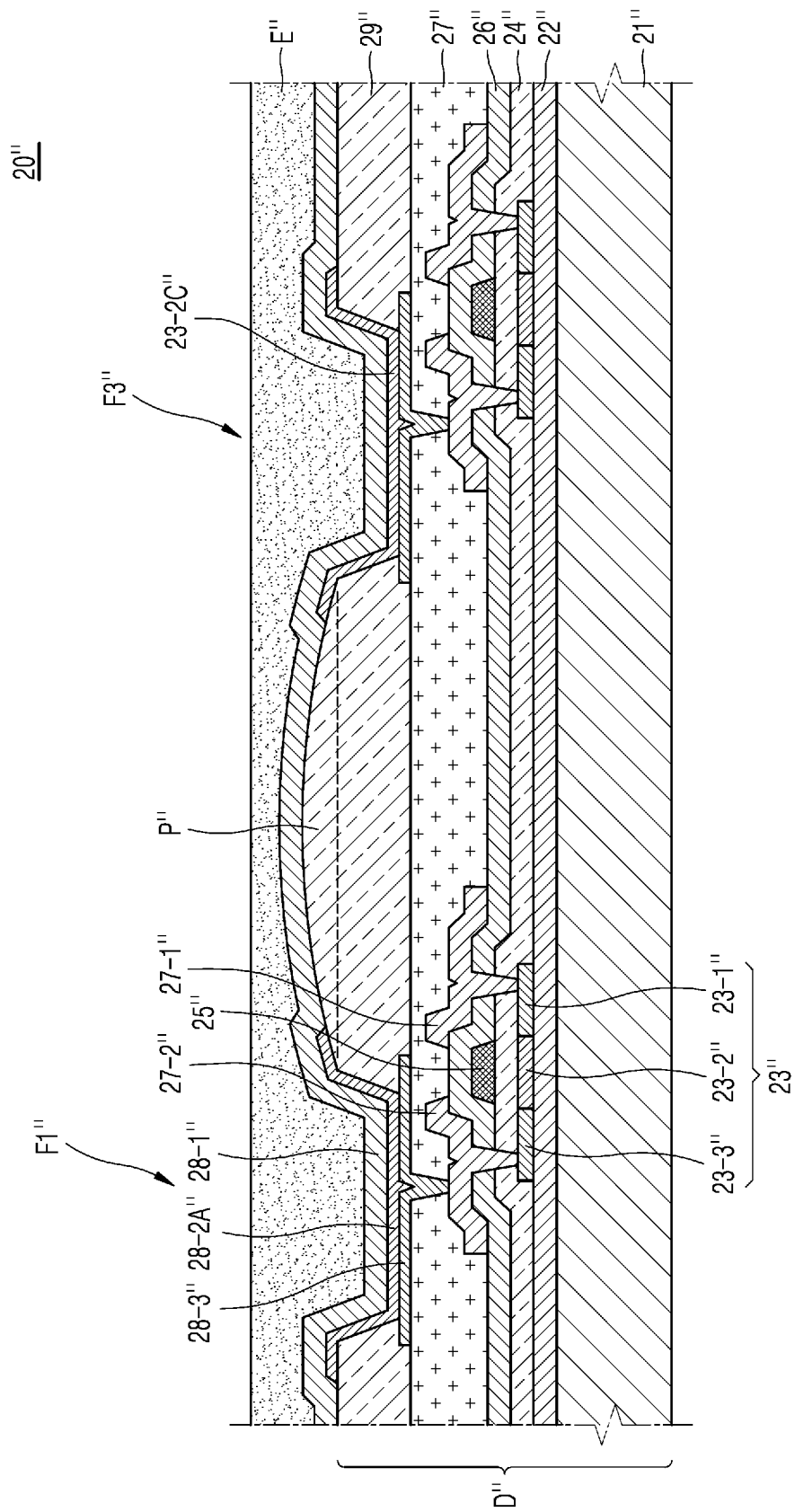
FIG. 13 is a cross-sectional view taken along the line B-B' of the display device shown in FIG. 12.
Figure 14:
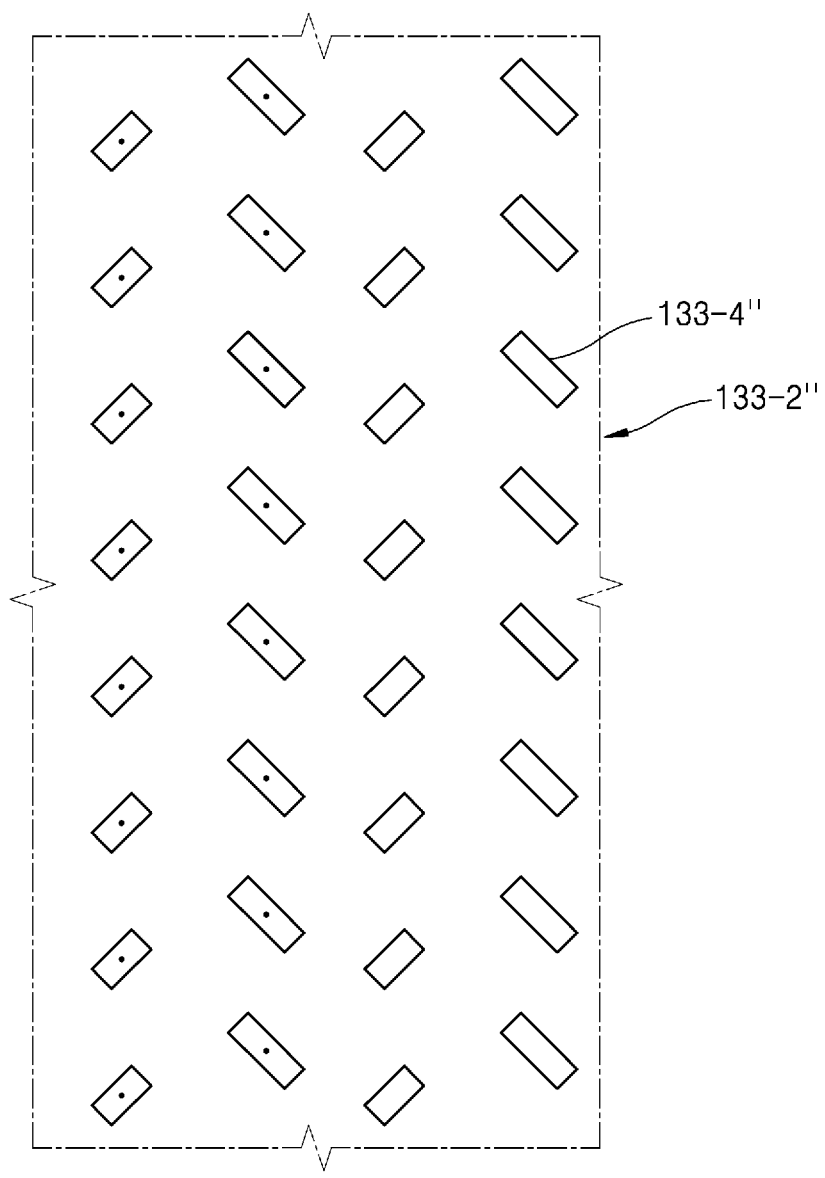
FIG. 14 is a plan view of a portion of a second mask sheet for depositing a second intermediate layer shown in FIG. 12.
Figure 15:
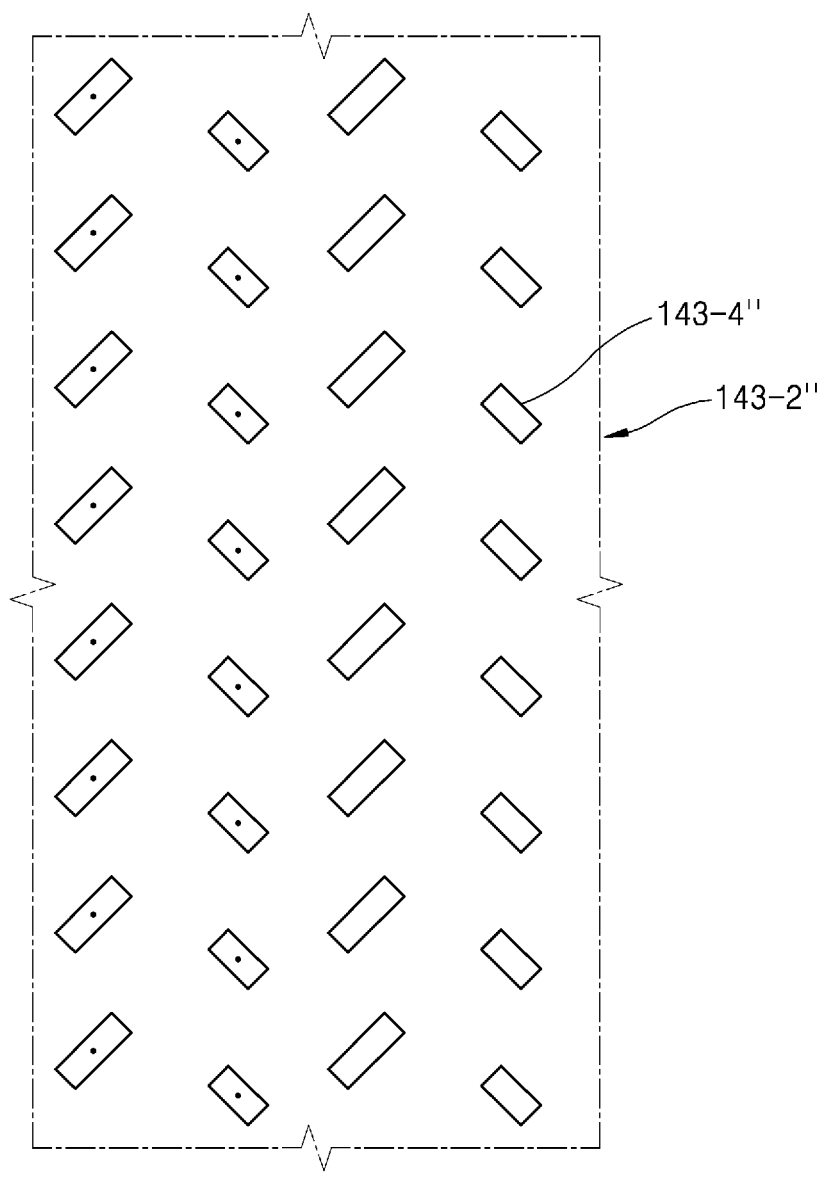
FIG. 15 is a plan view of a portion of a third mask sheet for depositing a third intermediate layer shown in FIG. 12.

FIG. 12 is a plan view of a first sub-pixel, a second sub-pixel, and a third sub-pixel of a display device according to another embodiment. FIG. 13 is a cross-sectional view taken along the line B-B' of the display device shown in FIG. 12. FIG. 14 is a plan view of a portion of a second mask sheet for depositing a second intermediate layer shown in FIG. 12. FIG. 15 is a plan view of a portion of a third mask sheet for depositing a third intermediate layer shown in FIG. 12.

Referring to FIGS. 12 to 15, a display device 20" may define a display area on a substrate 21" and a non-display area in a contour of the display area. A plurality of sub-pixels including a first sub-pixel F1", a second sub-pixel F2", and a third sub-pixel F3" may be disposed in the display area, and a power wire may be disposed in the non-display area. In addition, a pad portion may be disposed in the non-display area. The display device may include a display substrate D", an intermediate layer disposed in the display area, an opposite electrode 28-3", and a thin-film encapsulation layer.

The display device 20" may include a substrate 21", a buffer layer 22", an active layer 23", a gate insulating layer 24", a gate electrode 25", an interlayer insulating layer 26", a passivation film 27", a source electrode 27-1", a drain electrode 27-2", an organic light-emitting device 28", and a thin-film encapsulation layer E". The active layer 23 includes a source region 23-1" and a drain region 23-3", and further includes a channel region 23-2" therebetween. The organic light-emitting device 28" includes a pixel electrode 28-1", the intermediate layer, and an opposite electrode 28-3". In this case, the substrate 21", the buffer layer 22", the active layer 23", the gate insulating layer 24", the gate electrode 25", the interlayer insulating layer 26", the passivation film 27", the source electrode 27-1", the drain electrode 27-2", the organic light-emitting device 28", and the thin-film encapsulation layer E" are the same as or similar to those described above in FIG. 1, and thus, a detailed description thereof will not be given herein.

The first sub-pixel F1", the second sub-pixel F2", and the third sub-pixel F3" may emit lights of different colors. For example, one of the first sub-pixel F1", the second sub-pixel F2", and the third sub-pixel F3" emits blue light, another one of the first sub-pixel F1", the second sub-pixel F2", and the third sub-pixel F3" emits red light, and the other of the first sub-pixel F1", the second sub-pixel F2", and the third sub-pixel F3" emits green light.

One of the first sub-pixel F1", the second sub-pixel F2", and the third sub-pixel F3" may be a square, and the other two may be rectangles.

Hereinafter, for convenience of explanation, a case where the first sub-pixel F1" is a square and emits red light, the second sub-pixel F2" is a rectangle and emits green light, and the third sub-pixel F3" is a rectangle and emits blue light will be mainly described in detail.

The first sub-pixel F1" as described above may include a first intermediate layer 28-2A", and the first intermediate layer 28-2A" may correspond to the shape and position of the first sub-pixel F1". A planar area of the first intermediate layer 28-2A" may be equal to or greater than a planar area of the first sub-pixel F1", and the first sub-pixel F1" may be disposed inside the first intermediate layer 28-2A".

The second sub-pixel F2" may include a second intermediate layer 28-2B". In addition, the second intermediate layer 28-2B" my correspond to the shape and position of the second sub-pixel F2". The second sub-pixel F2" may be disposed inside the second intermediate layer 28-2B".

The third sub-pixel F3" may include a third intermediate layer 28-2C". In addition, the third intermediate layer 28-2C" may correspond to the shape and position of the third sub-pixel F3". The third sub-pixel F3" may be disposed inside the third intermediate layer 28-2C".

The second sub-pixel F2" may include a second intermediate layer 28-2B". In addition, the second intermediate layer 28-2B" my correspond to the shape and position of the second sub-pixel F2". The second sub-pixel F2" may be disposed inside the second intermediate layer 28-2B".

The third sub-pixel F3" may include a third intermediate layer 28-2C". In addition, the third intermediate layer 28-2C" may correspond to the shape and position of the third sub-pixel F3". The third sub-pixel F3" may be disposed inside the third intermediate layer 28-2C".

A planar area of the second sub-pixel F2" and a planar area of the third sub-pixel F3" may be different from each other.

In an embodiment, the planar area of the second sub-pixel F2" may be different from each other. For example, a portion of a plurality of second sub-pixels F2" may have different areas from another portion of the plurality of second sub-pixels F2". In particular, planar areas of a pair of second sub-pixels F2" adjacent to each other while facing one first sub-pixel F1" may be different from each other.

Furthermore, planar areas of a plurality of third sub-pixels F3" may also be different from each other. For example, some of the plurality of third sub-pixels F3" may have different areas from other ones of the plurality of third sub-pixels F3". In particular, planar areas of a pair of third sub-pixels F3" adjacent to each other while facing one first sub-pixel F1" may be different from each other.

In the above case, a distance between one of a first side S1" and a second side S2" of the first sub-pixel F1" and the second sub-pixel F2" facing one of the first side S1" and the second side S2" and a distance between an extension line of one of the first side S1" and the second side S2" of the first sub-pixel F1" and the third sub-pixel F3" facing one of the first side S1" and the second side S2" may be different from each other.

For example, in the second sub-pixel F2" and the third sub-pixel F3" facing the first side S1" or the extension line of the first side S1", a first distance L1" that is a shortest distance from the first side S1" or the extension line of the first side S1" to a short side (or one side or the center) of the second sub-pixel F2" and a second distance L2" that is the shortest distance from the first side S1" and or the extension line of the first side S1" to a short side (or one side or the center) of the third sub-pixel F3" may be different from each other. In particular, the first distance L1" may be longer than the second distance L2".

In the second sub-pixel F2" and the third sub-pixel F3" facing the second side S2" or the extension line of the second side S2", a third distance L3" that is the shortest distance from the second side S2" or the extension line of the second S2" to a short side (or one side or the center) of the second sub-pixel F2" and a fourth distance L4" that is the shortest distance from the second side S2" and or the extension line of the second side S2" to a short side (or one side or the center) of the third sub-pixel F3" may be different from each other. In particular, the third distance L3" may be shorter than the fourth distance L4".

As another embodiment, planar areas of the plurality of second sub-pixels F2" may be approximately equal to each other, and planar areas of a plurality of third sub-pixels F3" may be approximately equal to each other. In this case, the planar area of each of the second sub-pixel F2" may be greater or less than the planar area of each of the third sub-pixel F3". In the above case, in an embodiment, the pair of third sub-pixels F3" may be disposed so as to face the first side S1" and the second side S2", respectively, between a pair of second sub-pixel F2" disposed so as to face the first side S1" and the second side S2", respectively. In this case, the shortest distance from the first side S1" or the second side S2" to the short side (or one side or the center) of the second sub-pixel F2" may be less than the shortest distance from the first side S1" or the second side S2" to the short side (or one side or the center) of the third sub-pixel F3". Furthermore, as another embodiment, the pair of second sub-pixels F2" may be disposed so as to face the first side S1" and the second side S2", respectively, between the pair of third sub-pixel F3" disposed so as to face the first side S1" and the second side S2", respectively. In this case, the shortest distance from the first side S1" or the second side S2" to a short side (or one side or the center) of the second sub-pixel F2" may be greater than the shortest distance from the first side S1" or the second side S2" to a short side (or one side or the center) of the third sub-pixel F3".

Hereinafter, for convenience of explanation, a case where a planar area of some of the plurality of second sub-pixels F2" is different from a planar area of another portion of the plurality of second sub-pixels F2", a planar area of a portion of the plurality of third sub-pixels F3" is different from a planar area of another portion of the plurality of third sub-pixels F3", the first distance L1" and the second distance L2" are different from each other, and the third distance L3" and the fourth distance L4" are different from each other will be mainly described in detail.

A spacer P" may be disposed between each of the sub-pixels as described above. The spacer P" may be disposed on a pixel-defining layer 29" or formed integrally with the pixel-defining layer 29". The spacer P" may have various suitable shapes. For example, a plurality of spacers P may be formed in the form of protrusions and may be spaced apart from each other on the pixel-defining layer 29". As another embodiment, one spacer P" may be provided in a space between adjacent sub-pixels. However, the spacer P" is not limited thereto. Each mask sheet enters the inside of an opening of the pixel-defining layer 29" or is brought into close contact with the pixel-defining layer 29". Accordingly, when a deposition material is deposited on the display substrate D", it is possible to prevent or substantially prevent the occurrence of a defect caused when each mask assembly damages or breaks a portion of the display substrate D". In particular, the spacer P" may maintain a gap between an end of the opening of the pixel-defining layer 29" and each mask assembly when each mask assembly is brought into close contact with the substrate 21". Hereinafter, for convenience of explanation, a case where the spacer P" is disposed between the second sub-pixel F2" and the third sub-pixel F3" facing one first sub-pixel F1 and between a plurality of first sub-pixels F1" facing each other will be mainly described in detail.

The spacer P" may be formed integrally and concurrently (e.g., simultaneously) with the pixel-defining layer 29", or may be formed separately on the pixel-defining layer 29" after forming the pixel-defining layer 29". In this case, the spacer P" may use a material, which is the same as or different from that of the pixel-defining layer 29". Hereinafter, for convenience of explanation, a case where the spacer P" uses the same material as that of the pixel-defining layer 29" will be mainly described in detail.

In order to manufacture the first sub-pixel F1", the second sub-pixel F2", and the third sub-pixel F3" as described above, the display substrate D" may be supplied to the display device manufacturing apparatus described with reference to FIGS. 4 and 5.

In this case, a first deposition unit may supply a first deposition material to the display substrate D" to form a first intermediate layer 28-2A", a second deposition unit may supply a second deposition material to the display substrate D" to form a second intermediate layer 28-2B", and a third deposition unit may supply a third deposition material to the display substrate D" to form a third intermediate layer 28-2C".

In this case, a first mask sheet used in the first deposition unit may include a first opening formed to correspond to a shape of the first sub-pixel F1". In this case, a planar area of a first opening may be equal to or greater than a planar area of corresponding first sub-pixel F1". Furthermore, the planar area of one of the first openings may be equal to or greater than a planar area of the first intermediate layer 28-2A" formed by depositing the first deposition material having passed through the first opening on the display substrate D". A shape of the first opening, a shape of the first intermediate layer 28-2A", and a shape of the first sub-pixel F1", which correspond to each other, may be approximately equal to each other in a square shape.

A second opening 133-4" of a second mask sheet 133-2" used in the second deposition unit may be formed to correspond to a shape of the second sub-pixel F2". The second opening 133-4" may be arranged in the same manner as the arrangement of the second sub-pixel F2". In this case, a planar area of the second opening 133-4" may be equal to or greater than a planar area of the second sub-pixel F2", and may be equal to or greater than a planar area of the second intermediate layer 28-2B" formed by depositing the second deposition material on the display substrate D".

A third opening 143-4" of a third mask sheet 143-2" used in the third deposition unit is also formed to correspond to the shape of the third sub-pixel F3", and a planar area of the third opening 143-4" may be equal to or greater than the planar area of the third sub-pixel F3". Furthermore, the planar area of the third opening 143-4" may be equal to or greater than a planar area of the third intermediate layer 28-2C".

Here, a relationship among the first sub-pixel F1", the second sub-pixel F2", and the third sub-pixel F3" may be similar to those described in FIGS. 1 to 3. A relationship among the first intermediate layer 28-2A", the second intermediate layer 28-2B", and the third intermediate layer 28-2C" may be the same as the relationship among the first sub-pixel F1", the second sub-pixel F2", and the third sub-pixel F3".

For example, centers of some of the plurality of second sub-pixels F2" are on a straight line in one direction, and centers of another portion of the plurality of second sub-pixels F2" may be on a serpentine line in another direction. Furthermore, centers of a portion of a plurality of third sub-pixels F3" are on a straight line, and centers of another portion of the plurality of third sub-pixels F3" may be on a serpentine line in another direction. Centers of the plurality of first sub-pixels F1" may be on a straight line in a direction different from the one direction.

In addition, the second sub-pixel F2" and the third sub-pixel F3" facing the same first sub-pixel F1" may be tilted in opposite directions with respect to an extension direction of the second mask sheet 133-2" and an extension direction of the third mask sheet 143-2". In particular, in this case, the second sub-pixels F2" adjacent to each other may form an angle of about 45 degrees with respect to the extension direction of the second mask sheet 133-2" in opposite directions, respectively. Also, the second openings 133-4" formed in the second mask sheet 133-2" and adjacent to each other may form an angle of about 45 degrees with respect to the extension direction of the second mask sheet 133-2". The third sub-pixels F3" adjacent to each other may form an angle of about 45 degrees with respect to the extension direction of the third mask sheet 143-2" in opposite directions, respectively. Also, the third openings 143-4" formed in the third mask sheet 143-2" and adjacent to each other may form an angle of about 45 degrees with respect to the extension direction of the third mask sheet 143-2". The second intermediate layer 28-2B" and the third intermediate layer 28-2C" may be disposed on the display substrate D" at positions corresponding to the second opening 133-4" and the third opening 143-4", respectively.

The display device 20" may be fixed to a device such as a vehicle for moving a user. The display device 20" may be fixed to the device so as to form an angle different from 0 degrees between a user's viewing direction and the first direction or the second direction. For example, the display device 20" may be arranged so that the user's viewing direction of the display device 20" and the first direction or the second direction form an angle of about 90 degrees.

In the above case, when a user looks at the display device 20", an inclined portion of the pixel-defining layer 29" is not perpendicular to the user's viewing direction. Accordingly, external light may be prevented or substantially prevented from being reflected through the inclined portion of the pixel-defining layer 29" and incident on the user's eyes.

Further, the display device 20" may implement a precise image through each sub-pixel.

According to the display device manufacturing apparatus and the display device manufacturing method, it is possible to manufacture the display device 20" having an accurate deposition pattern.

Furthermore, according to the display device manufacturing apparatus and the method of manufacturing the display device, it is possible to minimize or substantially reduce an error between a design pattern and an actual deposition pattern that may occur during manufacturing.

Figure 16:
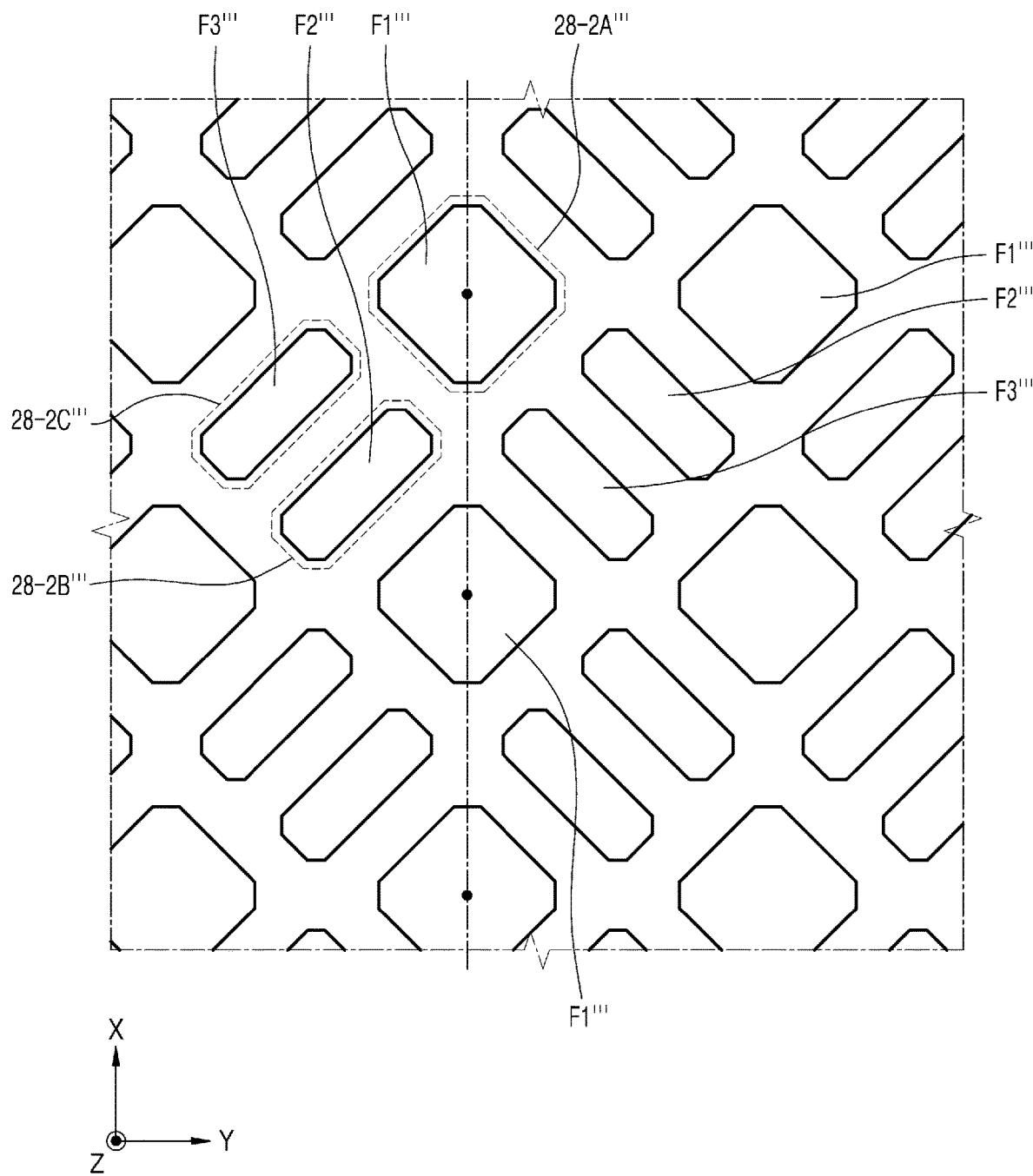
FIG. 16 is a plan view of a first sub-pixel, a second sub-pixel, and a third sub-pixel of a display device according to another embodiment.
Figure 17:
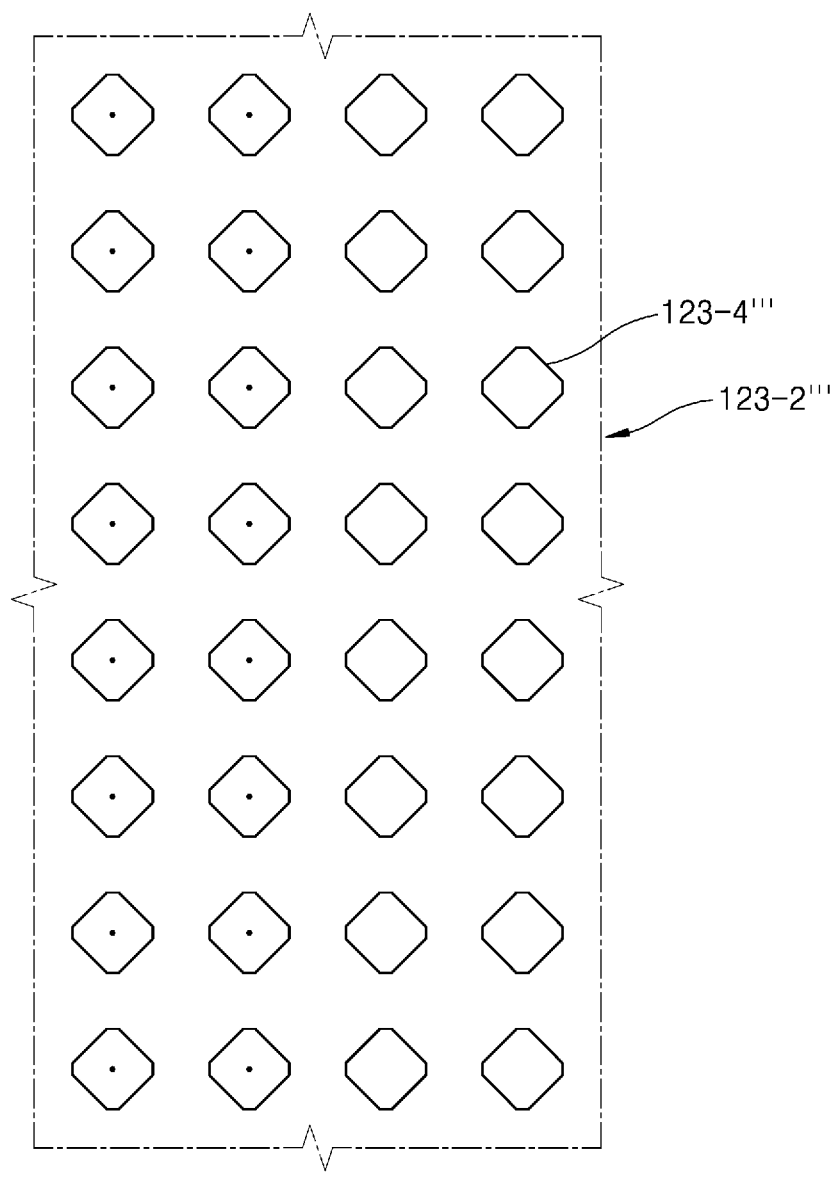
FIG. 17 is a plan view of a portion of a first mask sheet for depositing a first intermediate layer shown in FIG. 16.
Figure 18:
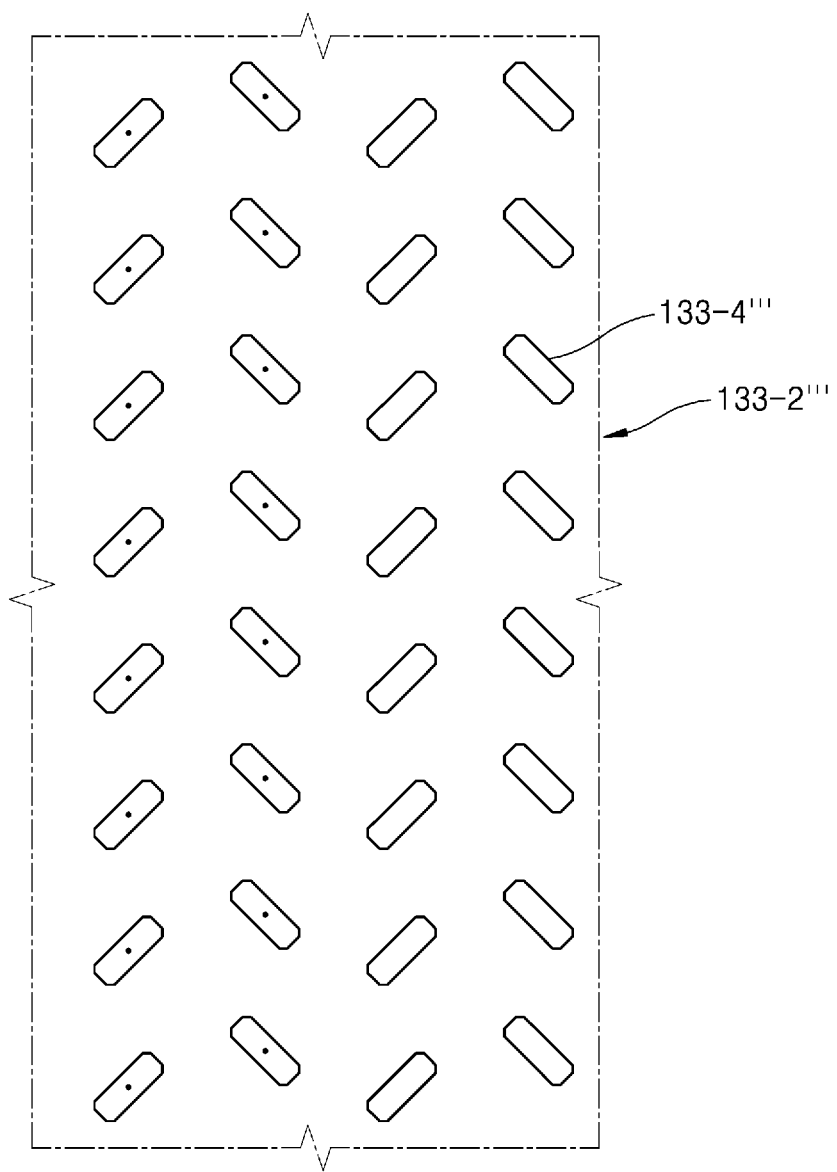
FIG. 18 is a plan view of a portion of a second mask sheet for depositing a second intermediate layer shown in FIG. 16.
Figure 19:
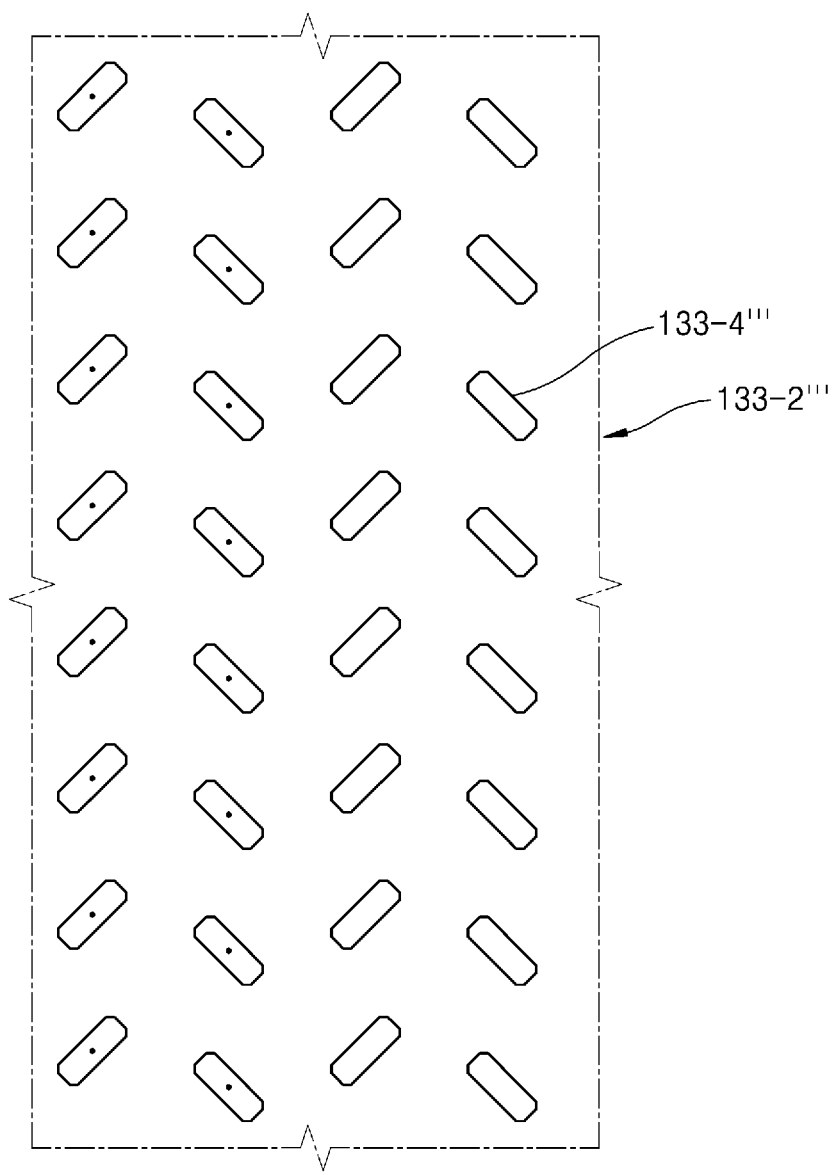
FIG. 19 is a plan view of a portion of a third mask sheet for depositing a third intermediate layer shown in FIG. 16.

FIG. 16 is a plan view of a first sub-pixel, a second sub-pixel, and a third sub-pixel of a display device according to another embodiment. FIG. 17 is a plan view of a portion of a first mask sheet for depositing a first intermediate layer shown in FIG. 16. FIG. 18 is a plan view of a portion of a second mask sheet for depositing a second intermediate layer shown in FIG. 16. FIG. 19 is a plan view of a portion of a third mask sheet for depositing a third intermediate layer shown in FIG. 16.

Referring to FIGS. 16 to 19, a display device may define a display area on a substrate and a non-display area in a contour of the display area. A plurality of sub-pixels including a first sub-pixel F1''', a second sub-pixel F2''', and a third sub-pixel F3''' may be disposed in the display area, and a power wire may be disposed in the non-display area. In addition, a pad portion may be disposed in the non-display area. The display device may include a display substrate, an intermediate layer disposed in the display area, an opposite electrode, and a thin-film encapsulation layer.

The first sub-pixel F1''', the second sub-pixel F2''', and the third sub-pixel F3''' may emit lights of different colors. For example, one of the first sub-pixel F1''', the second sub-pixel F2''', and the third sub-pixel F3''' emits blue light, another one of the first sub-pixel F1''', the second sub-pixel F2''', and the third sub-pixel F3''' emits red light, and the other of the first sub-pixel F1''', the second sub-pixel F2''', and the third sub-pixel F3''' emits green light.

One of the first sub-pixel F1''', the second sub-pixel F2''', and the third sub-pixel F3''' may be a square, and the other two may be rectangles.

Hereinafter, for convenience of explanation, a case where the first sub-pixel F1''' is a square and emits red light, the second sub-pixel F2''' is a rectangle and emits green light, and the third sub-pixel F3''' is a rectangle and emits blue light will be mainly described in detail.

The first sub-pixel F1''' as described above may include a first intermediate layer 28-2A''', and the first intermediate layer 28-2A''' may correspond to the shape and position of the first sub-pixel F1'''. A planar area of the first intermediate layer 28-2A''' may be greater than a planar area of the first sub-pixel F1''', and the first sub-pixel F1''' may be disposed inside the first intermediate layer 28-2'''.

The second sub-pixel F2''' may include a second intermediate layer 28-2B'''. In addition, the second intermediate layer 28-2B''' my correspond to the shape and position of the second sub-pixel F2'''. The second sub-pixel F2''' may be disposed inside the second intermediate layer 28-2B'''.

The third sub-pixel F3''' may include a third intermediate layer 28-2C'''. In addition, the third intermediate layer 28-2C''' may correspond to the shape and position of the third sub-pixel F3'''. The third sub-pixel F3''' may be disposed inside the third intermediate layer 28-2C'''.

The first sub-pixel F1''', the second sub-pixel F2''', and the third sub-pixel F3''' may be applied to the structures shown in FIGS. 1 to 3, FIG. 9, or FIG. 12 in the same or similar manner, and may be arranged the same as or similar to those described in FIGS. 1 to 3, FIG. 9, or FIG. 12.

The first sub-pixel F1''', the second sub-pixel F2''', and the third sub-pixel F3''' may have a chamfered edge. For example, in an embodiment, one of a vertex of the first sub-pixel F1''', a vertex of the second sub-pixel F2''', and a vertex of the third sub-pixel F3''' may be chamfered, and the remaining two of them may not be chamfered. As another embodiment, two of the vertex of the first sub-pixel F1''', the vertex of the second sub-pixel F2''', and the vertex of the third sub-pixel F3''' may be chamfered, and the remaining one of them may not be chamfered. As another embodiment, all of the vertex of the first sub-pixel F1''', the vertex of the second sub-pixel F2''', and the vertex of the third sub-pixel F3''' may be chamfered. Hereinafter, for convenience of explanation, a case where all of the vertex of the first sub-pixel F1''', the vertex of the second sub-pixel F2''', and the vertex of the third sub-pixel F3''' are chamfered will be mainly described in detail.

In order to form the vertex of the first sub-pixel F1''', the vertex of the second sub-pixel F2''', and the vertex of the third sub-pixel F3''' that are chamfered as described above, a vertex (or corner) of a first opening 123-4''' of a first mask sheet 123-2''', a vertex (or corner) of a second opening 133-4''' of a second mask sheet 133-2''', and a vertex (or corner) of a third opening 143-4''' of a third mask sheet 143-2''' may be chamfered. In this case, the first opening 123-4''', the second opening 133-4''', and the third opening 143-4''' may be the same as or similar to an octagonal shape. In particular, chamfered portions in the first opening 123-4''', the second opening 133-4''', and the third opening 143-4''' may be rounded or may be formed in a straight line shape.

When the vertex of the first opening 123-4''', the vertex of the second opening 133-4''', and the vertex of the third opening 143-4''' are chamfered as described above, stress may not be concentrated on the vertex of the first opening 123-4''', the vertex of the second opening 133-4''', and the vertex of the third opening 143-4''' when the first mask sheet 123-2''', the second mask sheet 133-2''', and the third mask sheet 143-2''' are extended. Therefore, when the first mask sheet 123-2''', the second mask sheet 133-2''', and the third mask sheet 143-2''' are extended, damage to the first mask sheet 123-2''', the second mask sheet 133-2''', and the third mask sheet 143-2''' may be prevented or substantially reduced. In addition, since a first deposition material, a second deposition material, and a third deposition material are not clogged together at the vertex of the first opening 123-4''', the vertex of the second opening 133-4''', and the vertex of the third opening 143-4''', the first intermediate layer 28-2A''', the second intermediate layer 28-2''', and the third intermediate layer 28-2C''' having the correct shape may be formed.

The display device may be manufactured through a display device manufacturing apparatus of the same or similar type as the display device manufacturing apparatus shown in FIGS. 4 and 5 described above.

In this case, a first deposition unit may supply a first deposition material to the display substrate to form the first intermediate layer 28-2A''', a second deposition unit may supply a second deposition material to the display substrate to form the second intermediate layer 28-2B''', and a third deposition unit may supply a third deposition material to the display substrate to form the third intermediate layer 28-2C'''.

In this case, the first mask sheet 123-2''' used in the first deposition unit may include the first opening 123-4''' formed to correspond to the shape of the first sub-pixel F1'''. In this case, a planar area of the first opening 123-4''' may be equal to or greater than a planar area of corresponding first sub-pixel F1'''. Also, the planar area of the first openings 123-4''' may be equal to or greater than a planar area of the first intermediate layer 28-2A''' formed by depositing the first deposition material having passed through the first opening 123-4''' on the display substrate. A shape of the first opening 123-4''', a shape of the first intermediate layer 28-2A''', and a shape of the first sub-pixel F1''', which correspond to each other, may be approximately equal to each other and be a square shape.

A second opening 133-4''' of a second mask sheet 133-2''' used in the second deposition unit may be formed to correspond to the shape of the second sub-pixel F2'''. The second openings 133-4''' may be arranged in the same manner as the arrangement of the second sub-pixels F2'''. In this case, a planar area of the second opening 133-4''' may be equal to or greater than a planar area of the second sub-pixel F2''', and may be equal to or greater than a planar area of the second intermediate layer 28-2B''' formed by depositing the second deposition material on the display substrate.

A third opening 143-4''' of a third mask sheet 143-2''' used in the third deposition unit is also formed to correspond to the shape of the third sub-pixel F3''', and a planar area of the third opening 143-4''' may be equal to or greater than the planar area of the third sub-pixel F3'''. Furthermore, the planar area of the third opening 143-4''' may be equal to or greater than the planar area of the third intermediate layer 28-2C'''.

Here, the first sub-pixel F1''', the second sub-pixel F2''' and the third sub-pixel F3''' may be similar to those described in FIGS. 1 to 3, FIG. 9, and FIG. 12. A relationship among the first intermediate layer 28-2A''', the second intermediate layer 28-2B''', and the third intermediate layer 28-2C''' may be the same as the relationship among the first sub-pixel F1''', the second sub-pixel F2''', and the third sub-pixel F3'''.

For example, centers of a portion of a plurality of second sub-pixels F2''' are on a straight line in one direction, and centers of another portion of the plurality of second sub-pixels F2''' may be on a serpentine line in another direction. Furthermore, centers of a portion of a plurality of third sub-pixels F3''' are on a straight line, and centers of another portion of the plurality of third sub-pixels F3''' may be on a serpentine line in another direction. Centers of a plurality of first sub-pixels F1''' may be on a straight line in a direction different from the one direction.

In addition, the second sub-pixel F2''' and the third sub-pixel F3''' facing the same first sub-pixel F1''' may be tilted in opposite directions with respect to an extension direction of the second mask sheet 133-2''' and an extension direction of the third mask sheet 143-2'''. In particular, in this case, the second sub-pixels F2''' adjacent to each other may form an angle of about 45 degrees with respect to the extension direction of the second mask sheet 133-2''' in opposite directions. Also, the second openings 133-4''' formed in the second mask sheet 133-2''' and adjacent to each other may form an angle of about 45 degrees with respect to the extension direction of the second mask sheet 133-2'''. The third sub-pixels F3''' adjacent to each other may form an angle of about 45 degrees with respect to the extension direction of the third mask sheet 143-2''' in opposite directions. Also, the third openings 143-4''' formed in the third mask sheet 143-2''' and adjacent to each other may form an angle of about 45 degrees with respect to the extension direction of the third mask sheet 143-2'''. The second intermediate layer 28-2B''' and the third intermediate layer 28-2C''' may be disposed on the display substrate at positions corresponding to the second opening 133-4''' and the third opening 143-4''', respectively.

The display device may be fixed to a device or the like that can be operated by a user such as a vehicle. The display device may be fixed to the device so as to form a certain angle different from 0 degrees between a user's viewing direction and the first direction or the second direction. For example, the display device may be arranged such that the user's viewing direction of the display device and the first direction or the second direction form an angle of about 90 degrees.

In the above case, when a user looks at the display device, an inclined portion of the pixel-defining layer is not perpendicular to the user's viewing direction. Accordingly, external light may be prevented or substantially prevented from being reflected through the inclined portion of the pixel-defining layer and incident on the user's eyes.

Further, the display device may implement a precise image through each sub-pixel.

According to the display device manufacturing apparatus and a display device manufacturing method, it is possible to manufacture the display device having an accurate deposition pattern.

Furthermore, according to the display device manufacturing apparatus and the display device manufacturing method, it is possible to minimize or substantially reduce an error between a design pattern and an actual deposition pattern that may occur during manufacturing.

Apparatus and method of manufacturing a display device according to embodiments may form various layers on the display substrate through chambers arranged in an in-line form.

Further, the apparatus and method of manufacturing the display device according to embodiments may simplify a process and reduce a process time.

An expression used in the singular encompasses the expression of the plural, unless it has a clearly different meaning in the context.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present. It will be understood that when a layer, region, or component is referred to as being "formed on" another layer, region, or component, it can be directly or indirectly formed on the other layer, region, or component. That is, for example, intervening layers, regions, or components may be present As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various suitable changes in form and details may be made therein without departing from the spirit and scope of the present invention as defined by the following claims and equivalents thereof.

What is claimed is:

1. A display device comprising:
a first sub-pixel having a square form;
a second sub-pixel positioned to face a first side of the first sub-pixel and having a rectangular form;
a third sub-pixel positioned to face the first side of the first sub-pixel spaced from the second sub-pixel and having a rectangular form;
a pixel-defining layer defining an area of at least one of the first sub-pixel, the second sub-pixel, and the third sub-pixel; and
a spacer protruding from the pixel-defining layer,
wherein the first side and a second side of the first sub-pixel come together at an angle, and
wherein the first sub-pixel, the second sub-pixel, and the third sub-pixel are configured to emit lights of different colors.

2. The display device of claim 1, wherein at least a portion of the second sub-pixel and at least a portion of the third sub-pixel are within a length range of one of the first side and the second side of the first sub-pixel.

3. The display device of claim 1, wherein a short side of the second sub-pixel is parallel to the first side or the second side of the first sub-pixel.

4. The display device of claim 1, wherein a short side of the third sub-pixel is parallel to the first side or the second side of the first sub-pixel.

5. The display device of claim 1, further comprising:
a plurality of first sub-pixels comprising the first sub-pixel, and centers of the first sub-pixels are on a straight line.

6. The display device of claim 1, further comprising:
a plurality of second sub-pixels comprising the second sub-pixel; and
a plurality of third sub-pixels comprising the third sub-pixel,
wherein centers of some sub-pixels of the plurality of second sub-pixels or the plurality of third sub-pixels are on a straight line in one direction.

7. The display device of claim 1, further comprising:
a plurality of second sub-pixels comprising the second sub-pixel; and
a plurality of third sub-pixels comprising the third sub-pixel,
wherein centers of some sub-pixels of the plurality of second sub-pixels or the plurality of third sub-pixels are on a serpentine line in one direction.

8. The display device of claim 1, wherein a plurality of first sub-pixels are arranged in a first direction, and
wherein the second sub-pixel faces the first side of the first sub-pixel, the second sub-pixel or the third sub-pixel faces the second side of the first sub-pixel, and the second sub-pixel and the third sub-pixel are arranged to be symmetrical about a straight line connecting centers of the first sub-pixels in the first direction.

9. The display device of claim 1, wherein a first distance that is a shortest distance from an edge of the first sub-pixel to the second sub-pixel and a second distance that is a shortest distance from the edge of the first sub-pixel to the third sub-pixel are approximately equal to each other.

10. The display device of claim 1, wherein a first distance that is a shortest distance from an edge of the first sub-pixel to the second sub-pixel and a second distance that is a shortest distance from the edge of the first sub-pixel to the third sub-pixel are different from each other.

11. The display device of claim 1, further comprising:
a plurality of second sub-pixels comprising the second sub-pixel; and
a plurality of third sub-pixels comprising the third sub-pixel,
wherein shortest distances of respective second sub-pixels arranged to face the first sub-pixel from an edge of the first sub-pixel to other second sub-pixels are different from each other, and
wherein shortest distances of respective third sub-pixels arranged to face the first sub-pixel from the edge of the first sub-pixel to other third sub-pixels are different from each other.

12. The display device of claim 1, wherein a plurality of first sub-pixels are arranged in a first direction, and
wherein a long side of the second sub-pixel or a long side of the third sub-pixel forms an angle of 45 degrees with respect to a straight line connecting centers of the first sub-pixels in the first direction.

13. The display device of claim 1, wherein an area of the first sub-pixel is greater than at least one of an area of the second sub-pixel and an area of the third sub-pixel.

14. The display device of claim 1, wherein an area of the second sub-pixel is different from an area of the third sub-pixel.

15. The display device of claim 1, wherein an outline connecting a portion of an edge of the second sub-pixel and a portion of an edge of the third sub-pixel is square.

16. The display device of claim 1, wherein a vertex of at least one of the first sub-pixel, the second sub-pixel, and the third sub-pixel is chamfered.

17. The display device of claim 1, wherein the one among the first sub-pixel, the second sub-pixel and the third sub-pixel is configured to emit blue light, another among the first sub-pixel, the second sub-pixel and the third sub-pixel is configured to emit red light, and an other among the first sub-pixel, the second sub-pixel and the third sub-pixel is configured to emit green light.

18. A display device comprising:
a plurality of first intermediate layers arranged in a square shape and spaced from each other; and
a plurality of second intermediate layers arranged to face the first intermediate layers, each of the plurality of second intermediate layers having a long side and a short side; and
a plurality of third intermediate layers spaced from the second intermediate layers and arranged in a rectangular shape and spaced from each other,
wherein the plurality of second intermediate layers are arranged such that an extension line of the long side of one of the plurality of second intermediate layers and an extension line of the long side of another one of the plurality of second intermediate layers cross each other, and
wherein the first intermediate layers, the second intermediate layers, and the third intermediate layers comprise materials configured to emit lights of different colors when power is applied to the first intermediate layers, the second intermediate layers, and the third intermediate layers.

19. The display device of claim 18, wherein the plurality of third intermediate layers are arranged such that extension lines of a long side of a portion of the plurality of third intermediate layers and extension lines of a long side of another portion of the plurality of third intermediate layers cross each other.

20. The display device of claim 18, wherein the second intermediate layers and the third intermediate layers are parallel to each other.

21. The display device of claim 18, wherein centers of a portion of the plurality of second intermediate layers and a center of some of at least one of the plurality of third intermediate layers are on a straight line.

22. The display device of claim 18, wherein, in a second intermediate layer and a third intermediate layer facing a corresponding first intermediate layer among the plurality of first intermediate layers, a shortest distance from a straight line overlapping one side of the corresponding first intermediate layer facing the second intermediate layer and the third intermediate layer to a center of the second intermediate layer and a shortest distance from the straight line to a center of the third intermediate layer are approximately equal to each other.

23. The display device of claim 18, wherein, in a second intermediate layer and a third intermediate layer facing a corresponding first intermediate layer among the plurality of first intermediate layers, a shortest distance from a straight line overlapping one side of the corresponding first intermediate layer facing the second intermediate layer and the third intermediate layer to a center of the second intermediate layer and a shortest distance from the straight line to a center of the third intermediate layer are different from each other.

24. The display device of claim 18, wherein shortest distances between respective second intermediate layers among the plurality of second intermediate layers and facing a corresponding first intermediate layers among the plurality of first intermediate layers and the corresponding first intermediate layers are different from each other.

25. A mask assembly comprising:
a mask frame; and
a plurality of mask sheets sequentially arranged along one side of the mask frame in an extended state above the mask frame,
wherein each of the mask sheets comprises a plurality of openings,
wherein some of the plurality of openings are tilted in a direction with respect to an extension direction of a mask sheet of the plurality of mask sheets and some other of the plurality of openings are tilted in a direction different from the direction of the some of the plurality of openings, and
wherein each of the plurality of openings has a rectangular form shape.

26. The mask assembly of claim 25, wherein each of the openings is formed at an angle of 45 degrees with respect to the extension direction of the mask sheet.

27. The mask assembly of claim 25, wherein centers of the some of the plurality of openings, which are arranged in the extension direction of the mask sheet, are on a line.

28. The mask assembly of claim 25, wherein centers of the some other of the plurality of openings, which are arranged in a direction perpendicular to the extension direction of the mask sheet, are on a serpentine line.

29. The mask assembly of claim 25, wherein each of the openings is rectangular.

30. The mask assembly of claim 29, wherein a vertex of each of the openings is chamfered.

31. A display device manufacturing apparatus comprising:
a chamber in which a display substrate is positioned;
a deposition source inside the chamber and supplying a deposition material into the chamber; and
a mask assembly positioned to face the deposition source and allowing the deposition material to pass therethrough in a pattern form,
wherein the mask assembly comprises:
a mask frame; and
a plurality of mask sheets sequentially arranged along one side of the mask frame in an extended state above the mask frame,
wherein each of the mask sheets comprises a plurality of openings,
wherein some of the plurality of openings are tilted in a direction with respect to an extension direction of a mask sheet of the plurality of mask sheets and some other of the plurality of openings are tilted in a direction different from the direction of the some of the plurality of openings, and
wherein each of the plurality of openings has a rectangular form shape.

32. The display device manufacturing apparatus of claim 31, wherein each of the openings is formed at an angle of 45 degrees with respect to the extension direction.

33. The display device manufacturing apparatus of claim 31, wherein centers of the openings, which are arranged in the extension direction of the mask sheet, are on a line.

34. The display device manufacturing apparatus of claim 31, wherein centers of the some other of the plurality of openings, which are arranged in a direction perpendicular to the extension direction of the mask sheet, are on a serpentine line.

35. The display device manufacturing apparatus of claim 31, wherein each of the openings is rectangular.

36. The display device manufacturing apparatus of claim 35, wherein a vertex of each of the openings is chamfered.

37. A display device manufacturing apparatus comprising:
a first deposition unit configured to form a plurality of first intermediate layers above a display substrate;
a second deposition unit connected to the first deposition unit and configured to deposit a plurality of second intermediate layers on the display substrate; and
a third deposition unit connected to the second deposition unit and configured to deposit a plurality of third intermediate layers on the display substrate,
wherein one of the first intermediate layers, the second intermediate layers, and the third intermediate layers are square, and a remaining two of them are rectangular,
wherein two of the first intermediate layers, the second intermediate layers, and the third intermediate layers are positioned so as to face a remaining one of the first intermediate layers, the second intermediate layers, and the third intermediate layers, and two of the first intermediate layers, the second intermediate layers, and the third intermediate layers are parallel to each other and facing a same side of the remaining one of the first intermediate layers, the second intermediate layers, and the third intermediate layers, and
wherein the first intermediate layers, the second intermediate layers, and the third intermediate layers comprise materials configured to emit lights of different colors when power is applied to the first intermediate layers, the second intermediate layers, and the third intermediate layers.

38. The display device manufacturing apparatus of claim 37, wherein the first intermediate layers, the second intermediate layers, and the third intermediate layers comprise different organic emission layers.

39. The display device manufacturing apparatus of claim 37, wherein some of the plurality of first intermediate layers, the plurality of second intermediate layers, or the plurality of third intermediate layers, which are square, are on a straight line in a first direction, and
wherein some of a remaining two of the plurality of first intermediate layers, the plurality of second intermediate layers, and the plurality of third intermediate layers, which are rectangular, and another portion of one of the plurality of first intermediate layers, the plurality of second intermediate layers, and the plurality of third intermediate layers, which are rectangular, are tilted in different directions with respect to the first direction.

40. The display device manufacturing apparatus of claim 37, wherein centers of some of one of the remaining two of the plurality of first intermediate layers, the plurality of second intermediate layers, and the plurality of third intermediate layers, which are square, are on a straight line or on a serpentine line.

41. The display device manufacturing apparatus of claim 37, wherein an outline connecting edges of two of the plurality of first intermediate layers, the plurality of second intermediate layers, and the plurality of third intermediate layers arranged in a rectangular shape and adjacent to each other is square.

42. The display device manufacturing apparatus of claim 37, wherein each of the first intermediate layers forms a first sub-pixel, each of the second intermediate layers forms a second sub-pixel, and each of the third intermediate layers forms a third sub-pixel, and
wherein an area of one of remaining two of a plurality of first sub-pixels, a plurality of second sub-pixels, and a plurality of third sub-pixels, which are rectangular, and an other area of one of remaining two of the plurality of first sub-pixels, the plurality of second sub-pixels, and the plurality of third sub-pixels which are rectangular are different from each other.

43. The display device manufacturing apparatus of claim 37, wherein a vertex of at least one of each of the first intermediate layers, each of the second intermediate layers, and each of the third intermediate layers is chamfered.

44. The display device manufacturing apparatus of claim 37, wherein the first deposition unit comprises a first mask assembly comprising a first mask sheet having a plurality of first openings corresponding to each of the first intermediate layers,
wherein the second deposition unit comprises a second mask assembly comprising a second mask sheet having a plurality of second openings corresponding to each of the second intermediate layers, and
wherein the third deposition unit comprises a third mask assembly comprising a third mask sheet having a plurality of third openings corresponding to each of the third intermediate layers.

45. The display device manufacturing apparatus of claim 44, wherein a vertex of at least one of each of the first intermediate layers, each of the second intermediate layers, and each of the third intermediate layers is chamfered.

46. The display device manufacturing apparatus of claim 44, wherein two of the first openings, the second openings, and the third openings are arranged in a state of being tilted with respect to an extension direction of one of the first mask sheet, the second mask sheet, and the third mask sheet.

47. A display device manufacturing method comprising:
depositing a first deposition material above a display substrate and forming a plurality of first intermediate layers;
depositing a second deposition material on the display substrate and forming a plurality of second intermediate layers; and
depositing a third deposition material on the display substrate and depositing a plurality of third intermediate layers,
wherein one of each of the first intermediate layers, each of the second intermediate layer, and each of the third intermediate layer is square, and a remaining two of them are rectangular,
wherein a remaining two of each of the first intermediate layers, each of the second intermediate layers, and each of the third intermediate layers that are rectangular are arranged to face one side of the one of each of the first intermediate layers, each of the second intermediate layers, and each of the third intermediate layers, and
wherein the first intermediate layers, the second intermediate layers, and the third intermediate layers comprise materials configured to emit lights of different colors when power is applied to the first intermediate layers, the second intermediate layers, and the third intermediate layers.

48. The display device manufacturing method of claim 47, wherein centers of some other of the remaining two of the plurality of first intermediate layers, the plurality of second intermediate layers, and the plurality of third intermediate layers, which are rectangular, are on a straight line in one direction or on a serpentine line.

49. The display device manufacturing method of claim 47, wherein centers of some other of the remaining two of the plurality of first intermediate layers, the plurality of second intermediate layers, and the plurality of third intermediate layers, which are rectangular, are on a straight line in one direction or on a serpentine line.

50. The display device manufacturing method of claim 47, wherein one of the remaining two of the plurality of first intermediate layers, the plurality of second intermediate layers, and the plurality of third intermediate layers, which are square, are positioned to be symmetrical about a straight line passing through a center of one of each of the first intermediate layers, each of the second intermediate layers, and each of the third intermediate layers, which are square.

51. The display device manufacturing method of claim 47, wherein one of the remaining two of the plurality of first intermediate layers, the plurality of second intermediate layers, and the plurality of third intermediate layers, which are rectangular, are positioned to be symmetrical about a straight line passing through a center of one of each of the first intermediate layers, each of the second intermediate layers, and each of the third intermediate layers, which are square.

52. The display device manufacturing method of claim 47, wherein the remaining two of each of the first intermediate layers, each of the second intermediate layers, and each of the third intermediate layers, which are rectangular, and face one of each of the first intermediate layers, each of the second intermediate layers, and each of the third intermediate layers ,which are square, have different shortest distances from one side or an extension line of the one side of the one of each of the first intermediate layers, each of the second intermediate layers, and each of the third intermediate layers, which are square, to each of the remaining two of each of the first intermediate layers, each of the second intermediate layers, and each of the third intermediate layers.

53. The display device manufacturing method of claim 47, wherein one of each of the first intermediate layers, each of the second intermediate layers, and each of the third intermediate layers that face one of each of the first intermediate layers, each of the second intermediate layers, and each of the third intermediate layers, which are square, has a shortest distance from one side or an extension line of the one side of the one of each of the first intermediate layers, each of the second intermediate layers, and each of the third intermediate layers, which are square, a shortest distance different from one of each of the first intermediate layers, each of the second intermediate layers, and each of the third intermediate layers which are rectangular to face one of each of the first intermediate layers, each of the second intermediate layers, and each of the third intermediate layers, which are square.

54. The display device manufacturing method of claim 47, wherein the first intermediate layers are square, and the second intermediate layers and the third intermediate layers are rectangular.

55. The display device manufacturing method of claim 47, wherein the first deposition material, the second deposition material, and the third deposition material comprise different organic light-emitting materials.

56. The display device manufacturing method of claim 47, wherein at least one of the first intermediate layers, the second intermediate layers, and the third intermediate layers have a chamfered vertex.

57. The display device manufacturing method of claim 47, wherein an outline connecting a portion of an edge of one of the remaining two of the plurality of first intermediate layers, the plurality of second intermediate layers, and the plurality of third intermediate layers, which are rectangular and adjacent to each other, to a portion of an edge of the other of the remaining two of the plurality of first intermediate layers, the plurality of second intermediate layers, and the plurality of third intermediate layers, which are rectangular, is square.

58. The display device manufacturing method of claim 47, wherein each of the first intermediate layers forms a first sub-pixel, each of the second intermediate layers forms a second sub-pixel, and each of the third intermediate layers form a third sub-pixel, and wherein an area of one of remaining two of a plurality of first sub-pixels, a plurality of second sub-pixels, and a plurality of third sub-pixels, which are rectangular, and an other area of one of remaining two of the plurality of first sub-pixels, the plurality of second sub-pixels, and the plurality of third sub-pixels which are rectangular are different from each other.

59. A display device comprising:
a first unit pixel including a first sub-pixel, a second sub-pixel, and a third sub-pixel of different respective colors; and
a second unit pixel adjacent to the first unit pixel, the second unit pixel including a first sub-pixel, a second sub-pixel, and a third sub-pixel, the first, second, and third sub-pixels being configured to emit different colors,
wherein the first sub-pixel of the first unit pixel and the first sub-pixel of the second unit pixel each emit light of a first color, the second sub-pixel of the first unit pixel and the second sub-pixel of the second unit pixel each emit light of a second color, and the third sub-pixel of the first unit pixel and the third sub-pixel of the second unit pixel each emit light of a third color,
wherein a first emission layer corresponding to the first sub-pixel of the first unit pixel includes:
a first side facing the second and third sub-pixels of the first unit pixel; and
a second side crossing the first side facing the second and third sub-pixels of the second unit pixel.

60. The display device of claim 59, wherein:
an area of the second sub-pixel of the first unit pixel is different from an area of the third sub-pixel of the first unit pixel, and
an area of the second sub-pixel of the second unit pixel is different from an area of the third sub-pixel of the second unit pixel.

61. The display device of claim 59, wherein a vertex of at least one selected from the first sub-pixel, the second sub-pixel, and the third sub-pixel is chamfered.

62. The display device of claim 59, wherein:
each of the second sub-pixels of the first and second unit pixels has a substantially rectangular shape, and
each of the third sub-pixels of the first and second unit pixels has a substantially rectangular shape.

63. The display device of claim 59, wherein:
each of the second sub-pixels of the first and second unit pixels has a width and a length, wherein the length of each of the second sub-pixels is greater than the width of each of the second sub-pixels, and
each of the third sub-pixels of the first and second unit pixels has a width and a length, wherein the length of each of the third sub-pixels is greater than the width of each of the third sub-pixels.

64. The display device of claim 59, wherein:
a center of the first sub-pixel of the first unit pixel and a center of the first sub-pixel of the second unit pixel are arranged along a first imaginary straight line, and
sides of the second sub-pixels of the first and second unit pixels and sides of the third sub-pixels of the first and second unit pixels extend along directions crossing the first imaginary straight line.

65. The display device of claim 59, wherein a first imaginary line connecting a center of the second sub-pixel of the first unit pixel and a center of the second sub-pixel of the second unit pixel crosses a second imaginary line connecting a center of the third sub-pixel of the first unit pixel and a center of the third sub-pixel of the second unit pixel.

66. The display device of claim 65, further comprising an additional first emission layer corresponding to the first sub-pixel of the second unit pixel,
wherein:
the first emission layer and the additional first emission layer are arranged in a first direction,
the additional first emission layer includes a first side and a second side crossing the first side, and
a corner portion of the first emission layer between the first side and the second side of the first emission layer and a corner portion of the additional first emission layer between the first side and the second side of the additional first emission layer face each other and are arranged along the first direction.

67. The display device of claim 66, wherein:
the second sub-pixel of the first unit pixel is closer to the first side of the additional first emission layer than the third sub-pixel of the first unit pixel, and
the third sub-pixel of the second unit pixel is closer to the second side of the additional first emission layer than the second sub-pixel of the second unit pixel.

68. The display device of claim 66, wherein:
a long side of the second sub-pixel of the first unit pixel is adjacent to the first side of the additional first emission layer, and a short side of the second sub-pixel of the first unit pixel is adjacent to the first side of the first emission layer, and
a long side of the third sub-pixel of the second unit pixel is adjacent to the second side of the additional first emission layer, and a short side of the third sub-pixel of the second unit pixel is adjacent to the second side of the first emission layer.

69. A display device comprising:
a plurality of first intermediate layers arranged in a square shape and spaced from each other; and
a second intermediate layer arranged to face one of the plurality of first intermediate layer, and having a rectangular shape; and
a third intermediate layer spaced from the second intermediate layer and having a rectangular shape,
wherein the second intermediate layer is arranged such that an extension line of a long side of the second intermediate layer crosses a straight line connecting centers of the plurality of first intermediate layers, and
wherein the plurality of first intermediate layers, the second intermediate layer, and the third intermediate layer comprise materials configured to emit lights of different colors when power is applied to the plurality of first intermediate layers, the second intermediate layer, and the third intermediate layer.

70. The display device of claim 69, wherein the second intermediate layer and the third intermediate layer are parallel to each other.

71. The display device of claim 69, wherein a center of one of the plurality of first intermediate layers and centers of the second and third intermediate layers are aligned along a straight line.

72. The display device of claim 71, wherein a center of an other one of the plurality of first intermediate layers is offset from a straight line connecting centers of the second and third intermediate layers.

73. The display device of claim 69, wherein a shortest distance between the second intermediate layer to a side of one of the plurality of first intermediate layers facing the second intermediate layer is approximately equal to a shortest distance between the third intermediate layer to the side of the one of the plurality of first intermediate layers.

74. The display device of claim 73, wherein a shortest distance between the second intermediate layer to a side of an other one of the plurality of first intermediate layers facing the second intermediate layer is different from a shortest distance between the third intermediate layer to the side of the other one of the plurality of first intermediate layers.

75. The display device of claim 69, wherein a short side of the second intermediate layer and a short side of the third intermediate layer face one of the plurality of first intermediate layers, and a long side of the second intermediate layer and a long side of the third intermediate layer face an other one of the plurality of first intermediate layers.

76. The display device of claim 69, wherein an area of the second intermediate layer is different from an area of the third intermediate layer, and
wherein an area of the second intermediate layer is different from an area of one of the plurality of first intermediate layers.

77. The display device of claim 69, wherein an area of the third intermediate layer is different from an area of the second intermediate layer, and
wherein an area of the third intermediate layer is different from an area of one of the plurality of first intermediate layers.

78. The display device of claim 69, wherein an area of one of the plurality of first intermediate layers is approximately equal to an area of an other one of the plurality of first intermediate layers.

79. The display device of claim 69, wherein, in the presence of electrical power,
the plurality of first intermediate layers are configured to generate a blue light,
the second intermediate layer is configured to generate a red light, and
the third intermediate layer is configured to generate a green light.

80. A display device comprising:
a first intermediate layer having a square shape; and
a plurality of second intermediate layers arranged to face the first intermediate layer, and having a rectangular shape; and
a third intermediate layer spaced from the first intermediate layer and the plurality of second intermediate layers, and having a rectangular shape,
wherein the plurality of second intermediate layers are arranged such that an extension line of a long side of one of the plurality of second intermediate layers and an extension line of a long side of an other one of the plurality of second intermediate layers cross each other, and wherein the first intermediate layer, the second intermediate layer, and the third intermediate layer comprise materials configured to emit lights of different colors when power is applied to the first intermediate layer, the plurality of second intermediate layers, and the third intermediate layer.

81. The display device of claim 80, wherein one of the second intermediate layers and the third intermediate layer are parallel to each other.

82. The display device of claim 80, wherein a shortest distance between one of the plurality of second intermediate layers to a side of the first intermediate layer facing the one of the plurality of second intermediate layers is approximately equal to a shortest distance between the third intermediate layer to the side of the first intermediate layer.

83. The display device of claim 80, wherein a shortest distance between one of the plurality of second intermediate layers to a first side of the first intermediate layer is different from a shortest distance between an other one of the plurality of second intermediate layers to a second side of the first intermediate layer.

84. The display device of claim 80, wherein a short side of one of the plurality of second intermediate layers and a short side of an other one of the plurality of second intermediate layers face adjacent sides of the first intermediate layer.

85. The display device of claim 80, wherein the third intermediate layer has a short side facing the first intermediate layer, and wherein a first corner of the short side is adjacent to one of the plurality of second intermediate layers and a second corner of the short side is adjacent to an other one of the plurality of second intermediate layers.

86. The display device of claim 80, wherein an area of each of the plurality of second intermediate layers is different from an area of each of the first and third intermediate layers.

87. The display device of claim 80, wherein an area of one of the plurality of second intermediate layers is approximately equal to an area of an other one of the plurality of second intermediate layers.

88. The display device of claim 80, wherein, in the presence of electrical power,
the first intermediate layer is configured to generate a blue light,
the plurality of second intermediate layers are configured to generate a red light, and
the third intermediate layer is configured to generate a green light.

89. A display device comprising:
a first unit pixel including a first sub-pixel, a second sub-pixel, and third sub-pixel of different respective colors;
a second unit pixel adjacent to the first unit pixel, the second unit pixel including a first sub-pixel, a second sub-pixel, and a third sub-pixel of different respective colors;
wherein the first sub-pixel of the first unit pixel and the first sub-pixel of the second unit pixel each emit light of a first color, the second sub-pixel of the first unit pixel and the second sub-pixel of the second unit pixel each emit light of a second color, and the third sub-pixel of the first unit pixel and the third sub-pixel of the second unit pixel each emit light of a third color,
wherein the first sub-pixel of the first unit pixel and the first sub-pixel of the second unit pixel are arranged in a row in a vertical direction, each of the second sub-pixel and the third sub-pixel of the first unit pixel is obliquely arranged to the vertical direction for the first sub-pixel of the first unit pixel, and each of the second sub-pixel and the third sub-pixel of the second unit pixel is obliquely arranged to the vertical direction for the first sub-pixel of the second unit pixel.

90. The display device of claim 89, wherein the second sub-pixel of the first unit pixel and the second sub-pixel of the second unit pixel are arranged in a row in the vertical direction, and the third sub-pixel of the first unit pixel and the third sub-pixel of the second unit pixel are arranged in a row in the vertical direction.

91. The display device of claim 89, wherein a direction of the second sub-pixel of the first unit pixel for the first sub-pixel of the first unit pixel is crossing a direction of the second sub-pixel of the second unit pixel for the first sub-pixel of the second unit pixel, and a direction of the third sub-pixel of the first unit pixel for the first sub-pixel of the first unit pixel is crossing a direction of the third sub-pixel of the second unit pixel for the first sub-pixel of the second unit pixel.

92. The display device of claim 89, wherein a direction of the second sub-pixel of the first unit pixel for the first sub-pixel of the first unit pixel is parallel to a direction of the second sub-pixel of the second unit pixel for the first sub-pixel of the second unit pixel, and a direction of the third sub-pixel of the first unit pixel for the first sub-pixel of the first unit pixel is parallel to a direction of the third sub-pixel of the second unit pixel for the first sub-pixel of the second unit pixel.

* * * * *